US010032896B2

(12) United States Patent
Matsuura

(10) Patent No.: US 10,032,896 B2
(45) Date of Patent: Jul. 24, 2018

(54) SEMICONDUCTOR DEVICE AND MANUFACTURING METHOD THEREOF

(71) Applicant: RENESAS ELECTRONICS CORPORATION, Tokyo (JP)

(72) Inventor: Hitoshi Matsuura, Ibaraki (JP)

(73) Assignee: RENESAS ELECTRONICS COPRORATION, Tokyo (JP)

( * ) Notice: Subject to any disclaimer, the term of this patent is extended or adjusted under 35 U.S.C. 154(b) by 0 days.

(21) Appl. No.: 15/785,027

(22) Filed: Oct. 16, 2017

(65) Prior Publication Data

US 2018/0053838 A1 Feb. 22, 2018

Related U.S. Application Data

(63) Continuation of application No. 15/181,024, filed on Jun. 13, 2016, now Pat. No. 9,818,853.

(30) Foreign Application Priority Data

Aug. 20, 2015 (JP) .................................. 2015-162718

(51) Int. Cl.
*H01L 29/739* (2006.01)
*H01L 21/768* (2006.01)
(Continued)

(52) U.S. Cl.
CPC .... *H01L 29/7397* (2013.01); *H01L 21/76895* (2013.01); *H01L 23/535* (2013.01);
(Continued)

(58) Field of Classification Search
CPC ............. H01L 29/7397; H01L 29/0696; H01L 29/66348; H01L 29/1095; H01L 29/7395; H01L 29/4236; H01L 29/66333
(Continued)

(56) References Cited

U.S. PATENT DOCUMENTS 9,041,050 B2 5/2015 Matsuura
2007/0215914 A1 9/2007 Loechelt
(Continued)

FOREIGN PATENT DOCUMENTS

EP 1271654 A1 1/2003
EP 2674979 A2 12/2013
(Continued)

OTHER PUBLICATIONS

Extended Search Report dated Jan. 18, 2017, issued in European Application No. 16183407.2.
(Continued)

*Primary Examiner* — Jonathan Han
(74) *Attorney, Agent, or Firm* — McDermott Will & Emery LLP

(57) ABSTRACT

The surface of an interlayer insulating film formed over an emitter coupling portion and the surface of an emitter electrode formed over the interlayer insulating film are caused to have a gentle shape, in particular, at the end of the emitter coupling portion, by forming the emitter coupling portion over a main surface of a semiconductor substrate and integrally with trench gate electrodes in order to form a spacer over the sidewall of the emitter coupling portion. Thereby, stress is dispersed, not concentrated in an acute angle portion of the emitter coupling portion when an emitter wire is coupled to the emitter electrode (emitter pad), and hence occurrence of a crack can be suppressed. Further, by forming the spacer, the concavities and convexities to be formed in the surface of the emitter electrode can be reduced, whereby the adhesiveness between the emitter electrode and the emitter wire can be improved.

7 Claims, 35 Drawing Sheets

(51) Int. Cl.
*H01L 23/535* (2006.01)
*H01L 29/10* (2006.01)
*H01L 29/66* (2006.01)
*H01L 29/06* (2006.01)
*H01L 29/40* (2006.01)
*H01L 29/423* (2006.01)
*H01L 29/417* (2006.01)

(52) U.S. Cl.
CPC ...... *H01L 29/0619* (2013.01); *H01L 29/0696* (2013.01); *H01L 29/1004* (2013.01); *H01L 29/1095* (2013.01); *H01L 29/407* (2013.01); *H01L 29/4236* (2013.01); *H01L 29/66348* (2013.01); *H01L 29/402* (2013.01); *H01L 29/41725* (2013.01)

(58) Field of Classification Search
USPC ... 257/E29.198, E29.201, E29.027, E29.104
See application file for complete search history.

(56) References Cited

U.S. PATENT DOCUMENTS

| | | | | |
|---|---|---|---|---|
| 2012/0292662 | A1* | 11/2012 | Matsuura | H01L 29/66348 257/139 |
| 2013/0175574 | A1* | 7/2013 | Matsuura | H01L 29/66348 257/139 |
| 2013/0328105 | A1* | 12/2013 | Matsuura | H01L 29/0696 257/139 |
| 2015/0008513 | A1 | 1/2015 | Lin et al. | |

FOREIGN PATENT DOCUMENTS

| | | |
|---|---|---|
| JP | 2013-140885 A | 7/2013 |
| WO | 03/023862 A1 | 3/2003 |

OTHER PUBLICATIONS

U.S. Notice of Allowance dated Aug. 10, 2017, issued in the Parent U.S. Appl. No. 15/181,024.

U.S. Non-Final Office Action dated Feb. 2, 2017, issued in the Parent U.S. Appl. No. 15/181,024.

\* cited by examiner

SEMICONDUCTOR DEVICE AND MANUFACTURING METHOD THEREOF

CROSS-REFERENCE TO RELATED APPLICATIONS

The present application is a continuation of U.S. patent application Ser. No. 15/181,024, filed Jun. 13, 2016, which claims priority from Japanese Patent Application No. 2015-162718 filed on Aug. 20, 2015, the contents of which are hereby incorporated by reference into this application.

BACKGROUND

The present invention relates to a semiconductor device and a manufacturing method thereof, and can be preferably used in a semiconductor device including, for example, an IE (Injection Enhancement) type trench gate IGBT (Insulated Gate Bipolar Transistor).

For example, Japanese Unexamined Patent Application Publication No. 2013-140885 (Patent Document 1) discloses an IE-type trench gate IGBT basically formed by a first linear unit cell region having a linear active cell region, a second linear unit cell region having a linear hole collector cell region, and a linear inactive cell region between them.

RELATED ART DOCUMENT

Patent Document

[Patent Document 1] Japanese Unexamined Patent Application Publication No. 2013-140885

SUMMARY

In an IE-type trench gate IGBT, an emitter-coupling portion, which is formed integrally with a trench gate electrode formed in a trench, is provided over a main surface of a semiconductor substrate in order to improve the reliability of the electrical coupling between the trench gate electrode and an emitter electrode. However, there is the fear that, when an emitter wire is coupled to the emitter electrode, stress in the emitter wire may be concentrated in an acute angle portion at the end of the emitter coupling portion, whereby a crack may be caused. Additionally, because concavities and convexities are formed in the surface of the emitter electrode, there is the problem that the adhesiveness between the emitter wire and the emitter electrode is deteriorated.

Other problems and new characteristics will become clear from the description and accompanying drawings of the present specification.

A semiconductor device according to one embodiment has: a first trench that penetrates a p-type body region to reach an n$^-$-type drift region; a second trench that penetrates the p-type body region to reach the n$^-$-type drift region and is formed to be spaced apart from the first trench; and an n$^+$-type emitter region formed in the p-type body region so as to come in contact with the side surface of the first trench. Further, the semiconductor device has: a first trench gate electrode formed inside the first trench via a first insulating film; a second trench gate electrode formed inside the second trench via a second insulating film; an emitter coupling portion that is formed over a main surface of a semiconductor substrate via a third insulating film and is formed integrally with the second trench gate electrode; and a spacer formed over the sidewall of the emitter coupling portion. Furthermore, the semiconductor device has: a fourth insulating film formed over the main surface of the semiconductor substrate so as to cover the emitter coupling portion and the spacer; a first opening that penetrates the fourth insulating film to come in contact with the n$^+$-type emitter region; a second opening that penetrates the fourth insulating film to come in contact with the emitter coupling portion; and an emitter electrode that is electrically coupled to the n$^+$-type emitter region via the first opening and is electrically coupled to the emitter coupling portion via the second opening.

A manufacturing method of a semiconductor device according to one embodiment has the following steps. A first trench and a second trench, each having a first depth from a main surface of a semiconductor substrate, are formed to be spaced apart from each other. Subsequently, a first conductive film is formed, via a first insulating film, over the main surface of the semiconductor substrate including the inside of each of the first trench and the second trench, and then a first trench gate electrode is formed inside the first trench via the first insulating film by processing the first conductive film; a second trench gate electrode is formed inside the second trench via the first insulating film; and an emitter coupling portion is formed over the main surface of the semiconductor substrate via the first insulating film and formed integrally with the second trench gate electrode. Subsequently, a p-type body region, having from the main surface of the semiconductor substrate a second depth smaller than the first depth, is formed; and an n$^+$-type emitter region, coming into contact with the side surface of the first trench, is formed in the p-type body region. Subsequently, a second conductive film is formed over the main surface of the semiconductor substrate via a second insulating film so as to cover the emitter coupling portion, and then a spacer including the second conductive film is formed over the sidewall of the emitter coupling portion via the second insulating film by processing the second conductive film. Subsequently, a third insulating film is formed over the main surface of the semiconductor substrate so as to cover the emitter coupling portion and the spacer, and then a first opening, penetrating the third insulating film to come in contact with the n$^+$-type emitter region, and a second opening, penetrating the third insulating film to come in contact with the emitter coupling portion, are formed. Subsequently, a third conductive film is formed over the main surface of the semiconductor substrate including the inside of each of the first opening and the second opening, and then an emitter electrode, which is electrically coupled to the n$^+$-type emitter region via the first opening and is electrically coupled to the emitter coupling portion via the second opening, is formed by processing the third conductive film.

According to one embodiment, the yield and reliability of a semiconductor device including a trench gate IGBT can be improved.

DETAILED DESCRIPTION

Figure 1:
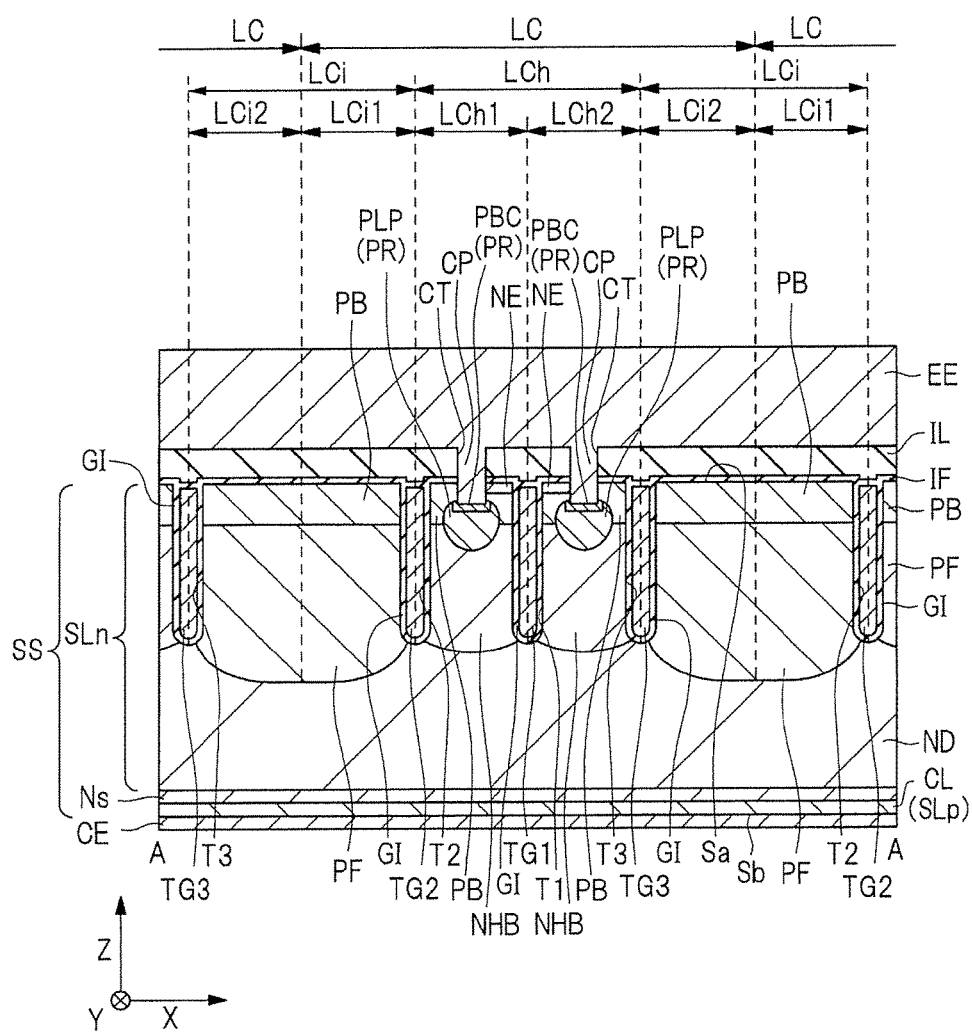
FIG. 1 is a sectional view (A-A cross section) illustrating a configuration of a semiconductor device according to an embodiment.

If needed for convenience, the following embodiments will be described by dividing each of them into multiple sections or embodiments; however, the multiple sections or embodiments are not irrelevant to each other, but they are in a relationship in which one is a variation, application example, detailed description, or supplementary description of part or the whole of the others, unless otherwise indicated. When the numbers of elements, etc. (including numbers of pieces, numerical values, amounts, ranges, etc.) are referred to in the following embodiments, the numbers are not limited to the specific ones but may be more or less than the specific numbers, unless otherwise indicated or except when the numbers are obviously limited to the specific numbers in principle.

Further, in the following embodiments, the constituents (also including element steps, etc.) are not necessarily essential, unless otherwise indicated or clearly essential in principle. Similarly, when the shapes and positional relations, etc., of the constituents, etc., are referred to in the following embodiments, those substantially the same or similar to the shapes, etc., should also be included, unless otherwise indicated or except when considered to be clearly otherwise in principle. The same is true with the aforementioned numbers, etc., (including the numbers of pieces, numerical values, amounts, and ranges, etc.).

Hereinafter, preferred embodiments will be described in detail with reference to the accompanying views. In the whole views for explaining the embodiments, members having the same function as each other will be denoted with the same or relevant reference numeral and duplicative description will be omitted. When a plurality of similar members (parts) are present, an individual or specific part may be represented by adding a sign to the collective reference numeral. In the following embodiments, description of the same or similar parts will not be repeated in principle, unless particularly necessary.

In the views used in the embodiments, hatching may be omitted even in sectional views in order to make them easier to see. Alternatively, hatching may be added even in plan views in order to make them easier to see.

In a sectional view or a plan view, the size of each part does not correspond to that of an actual device, and a specific part may be displayed to be relatively large in order to make the view easier to understand. The same is true with the case where a sectional view and a plan view correspond to each other.

Embodiment

Hereinafter, a semiconductor device according to the present embodiment will be described in detail with reference to drawings. The semiconductor device according to the embodiment is an IE-type trench gate IGBT. The semiconductor device exhibits an IE effect in which, when the IGBT is in an ON state, discharge of holes toward the side of an emitter electrode (surface side) is restricted, whereby the concentration of the holes stored in a drift region can be increased, and hence the semiconductor device is referred to as an IE type. Further, of three trench gate electrodes arrayed to be spaced apart from each other in the semiconductor device according to the embodiment, the trench gate electrode (TG1) arranged in the center is electrically coupled to a gate electrode, and each of the two trench gate electrodes (TG2, TG3) arranged at both the ends is electrically coupled to an emitter electrode, and hence the semiconductor device is also referred to as an EGE type (Emitter-Gate-Emitter type).

<<Structure of IE-Type Trench Gate IGBT>>

Figure 2:
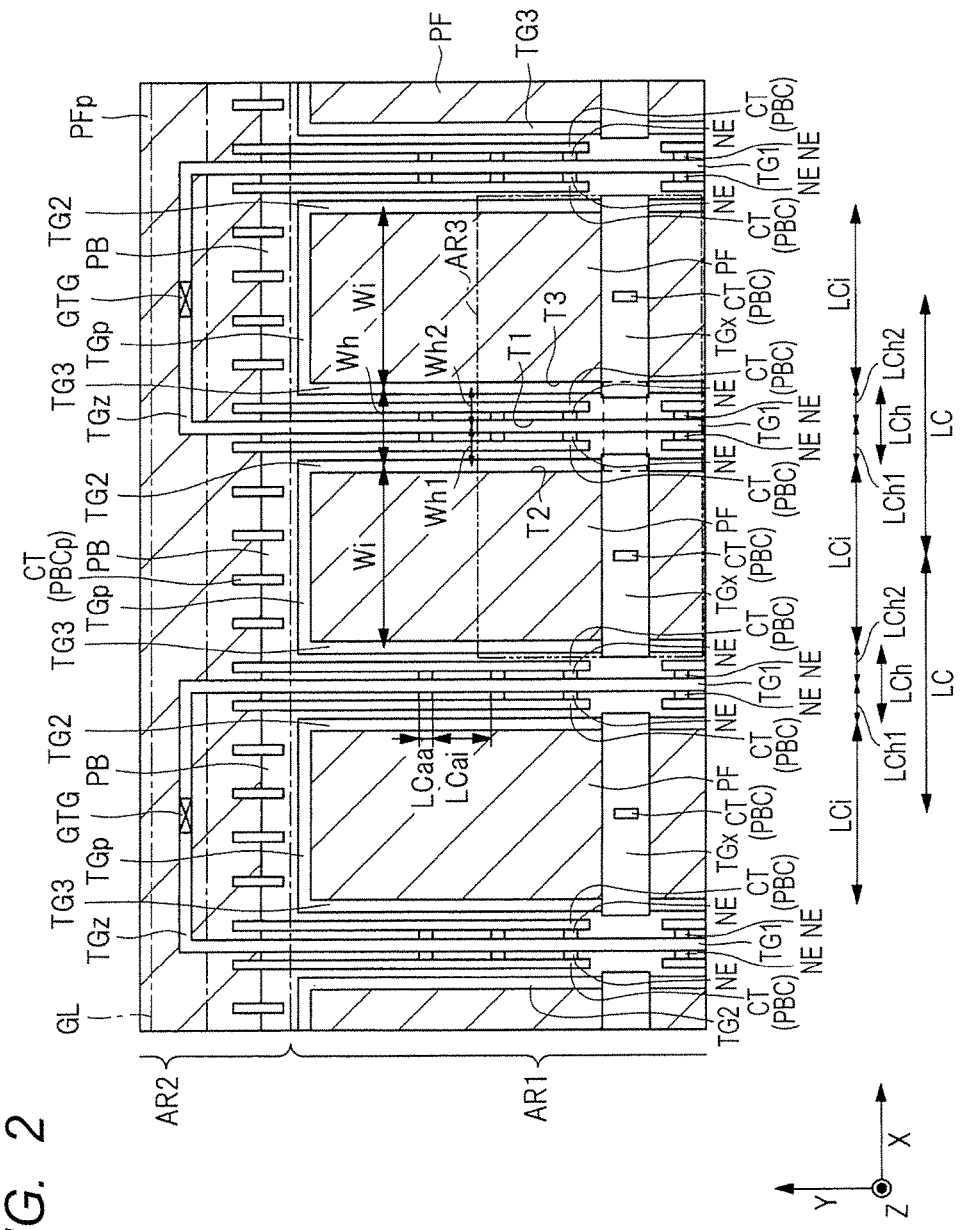
FIG. 2 is a plan view illustrating a configuration of a semiconductor device according to an embodiment.
Figure 3:
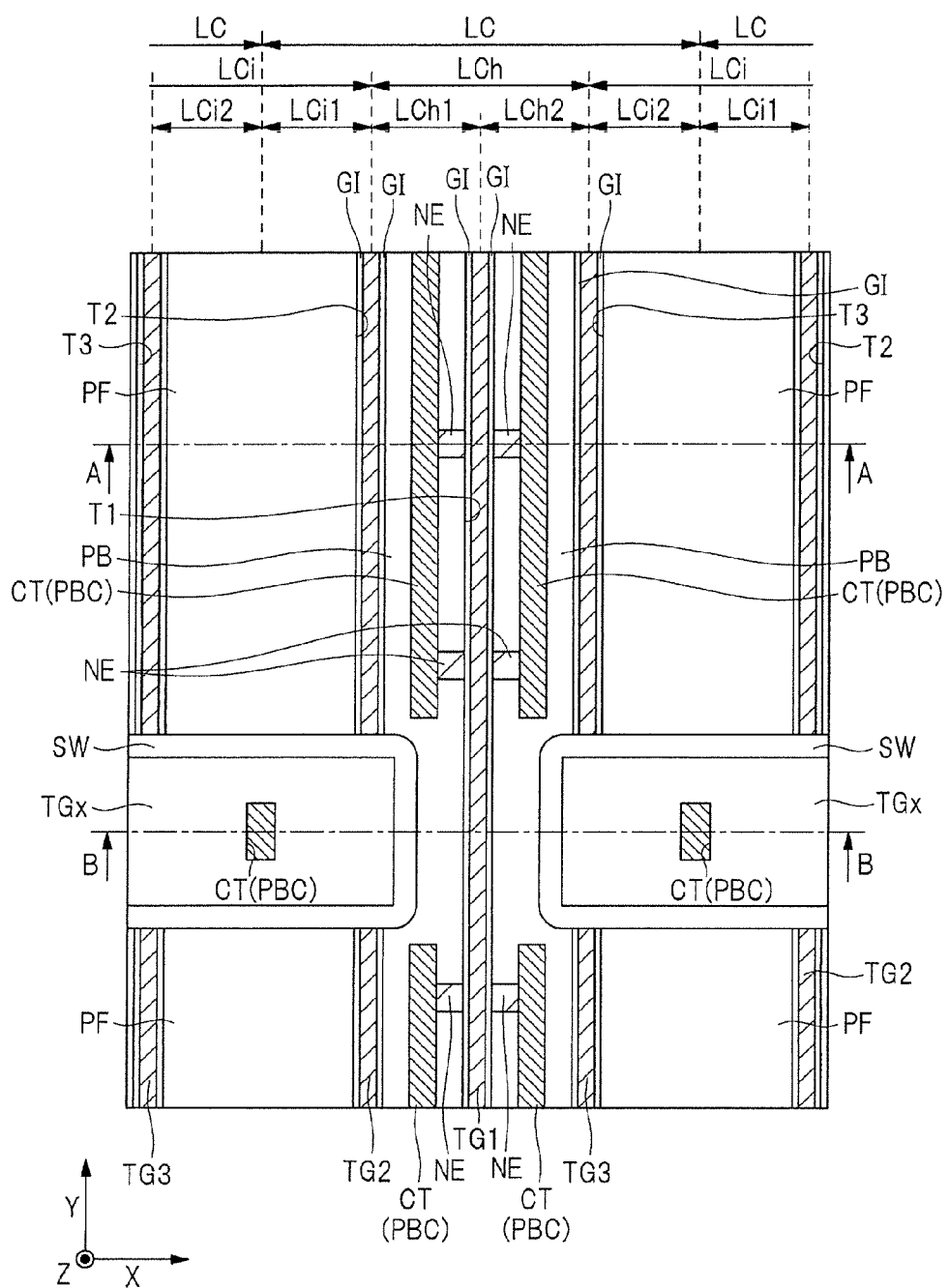
FIG. 3 is a plan view illustrating a configuration of a semiconductor device according to an embodiment.
Figure 4:
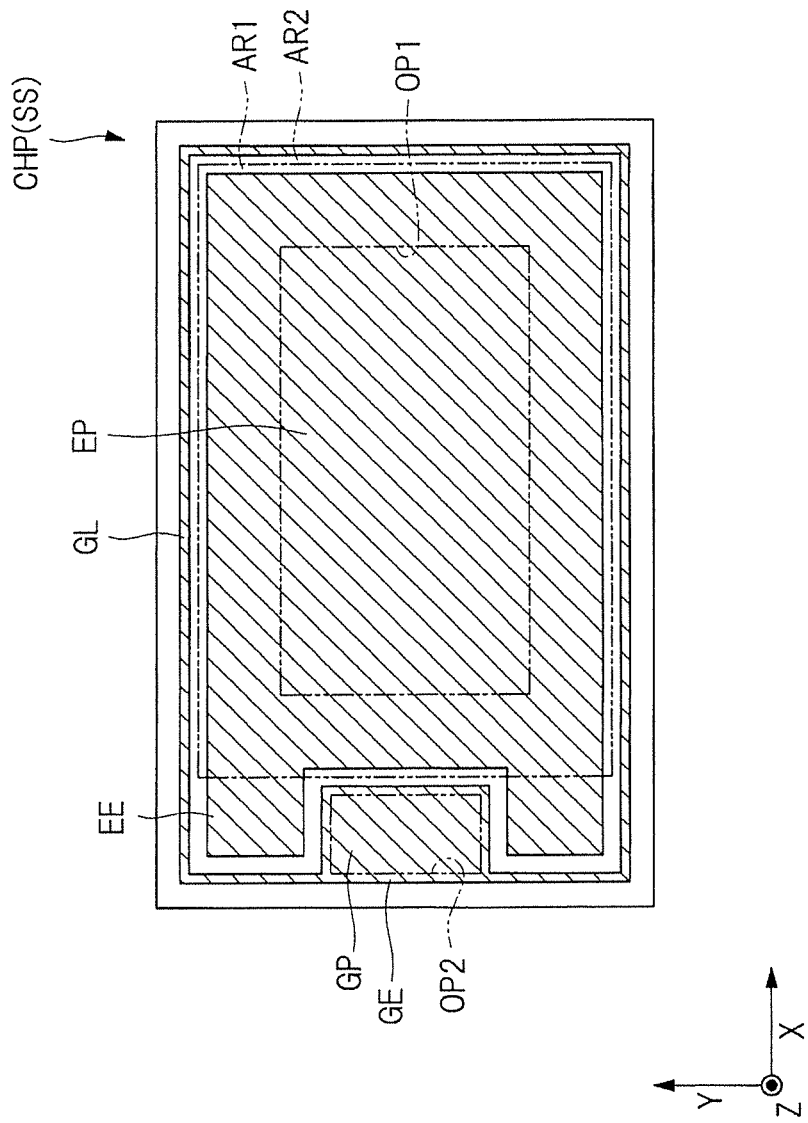
FIG. 4 is a plan view illustrating a configuration of a semiconductor device (semiconductor chip) according to an embodiment.

FIG. 1 is a sectional view illustrating a configuration of the semiconductor device according to the present embodiment, and FIGS. 2 and 3 are plan views each illustrating the configuration of the semiconductor device according to the embodiment. FIG. 1 corresponds, for example, to the A-A cross section in FIG. 3. FIG. 3 corresponds, for example, to the region surrounded by the two-dot chain line in FIG. 2. FIG. 4 is a plan view illustrating the configuration of the semiconductor device (semiconductor chip) according to the embodiment.

The configuration of the semiconductor device according to the present embodiment will be described with reference to FIGS. 1 to 4.

A semiconductor substrate SS has an upper surface (main surface) Sa and a lower surface (main surface) Sb opposite to the upper surface Sa. The semiconductor substrate SS has an n-type semiconductor layer SLn on the side of the upper surface Sa and a semiconductor layer SLp on the side of the lower surface Sb.

An n$^-$-type drift region (n-type semiconductor region) ND is formed in a lower portion of the semiconductor layer SLn. An n-type field stop region (n-type semiconductor region) Ns is formed between the semiconductor layer SLn and the semiconductor layer SLp. The semiconductor layer SLp corresponds to a p$^+$-type collector region (p-type semiconductor region) CL. A collector electrode CE is formed over the lower surface Sb of the semiconductor substrate SS (below the p$^+$-type collector region CL).

A p-type body region PB is provided in an upper portion of the semiconductor layer SLn. A trench (trench portion) T1 is formed on the side of the upper surface Sa of the semiconductor substrate SS in the center of FIG. 1. The trench T1 is formed to penetrate the p-type body region PB from the upper surface Sa and to reach the middle of the semiconductor layer SLn. The trench T1 is also formed to reach the n$^-$-type drift region ND. The shape of the trench T1 obtained when viewed from above (hereinafter, referred to as a planar shape) is a rectangular shape (linear shape) whose long side extends in the Y direction. Thus, the trench T1 extends in the Y direction (FIGS. 2, 3).

A gate insulating film GI is formed over the internal wall of the trench T1. Inside the trench T1, a trench gate electrode TG1 is formed over the gate insulating film GI so as to fill up the trench T1 (FIG. 1). The trench gate electrode TG1 is electrically coupled to the later-described gate electrode GE (see FIG. 4). The trench gate electrode TG1 is formed continuously along the Y direction in plan view (FIGS. 2, 3).

On the other hand, trenches T2 and T3 are formed on both the sides of the trench T1 so as to be spaced apart from each other by a predetermined distance (Wh1, Wh2).

Herein, the region between the trench T2 and the trench T3 is a hybrid cell region LCh, and of the hybrid cell region LCh, the region between the trench T2 and the trench T1 is assumed to be a hybrid sub-cell region LCh1, and that between the trench T3 and the trench T1 is assumed to be a hybrid sub-cell region LCh2. Accordingly, it can be said that the trench T1 is located in the central portion of the hybrid cell region LCh, i.e., located at the boundary portion between the hybrid sub-cell region LCh1 and the hybrid sub-cell region LCh2. The width in the X direction of the hybrid sub-cell region LCh1 is Wh1, and that in the X direction of the hybrid sub-cell region LCh2 is Wh2.

Inactive cell regions LCi are located on both the sides of the hybrid cell region LCh. That is, a plurality of the hybrid cell regions LCh are arranged as illustrated in FIG. 2, and the inactive cell region LCi is arranged between the hybrid cell regions LCh. These regions extend in the Y direction.

Because the hybrid cell regions LCh are thus repeatedly arranged via the inactive cell regions LCi, the trench T2 is arranged on the right side of the hybrid cell region LCh so as to be spaced apart by the width (Wi) of the inactive cell region LCi, for example, in FIG. 2. Also, the trench T3 is arranged on the left side of the hybrid cell region LCh so as to be spaced apart by the width (Wi) of the inactive cell region LCi, in FIG. 2.

Herein, a unit cell region LC is defined as a region having: the hybrid cell region LCh; a portion LCi1 of the inactive cell region LCi on one side (the left side in FIG. 1) of the hybrid cell region LCh; and a portion LCi2 of the inactive cell region LCi on the other side (the right side in FIG. 1) thereof. The portion LCi1 is a half portion of the inactive cell region LCi on the side of the trench T2. The portion LCi2 is a half portion of the inactive cell region LCi on the side of the trench T3. Accordingly, it can be said that, in FIG. 1, a plurality of the unit cell regions LC are repeatedly arranged in the X direction. Herein, it is more preferable to make the width Wh of the hybrid cell region LCh smaller than the width Wi of the inactive cell region LCi (FIG. 2). In other words, it is more preferable to make the width of each of the hybrid sub-cell regions LCh1 and LCh2 smaller than the half of the width Wi of the inactive cell region LCi. In other words, it is more preferable to make the width of each of the hybrid sub-cell regions LCh1 and LCh2 smaller than the width of each of the portions LCi1 and LCi2 of the inactive cell region LCi.

The trenches T2 and T3 respectively reach the middle of the semiconductor layer SLn from the upper surface Sa, and are arranged on both the sides of the trench T1 so as to sandwich it, and respectively extend in the Y direction in plan view.

The gate insulating film GI is formed over the internal wall of each of the trenches T2 and T3. Inside the trench T2, a trench gate electrode TG2 is formed over the gate insulating film GI so as to fill up the trench T2. Inside the trench T3, a trench gate electrode TG3 is formed over the gate insulating film GI so as to fill up the trench T3. Each of the trench gate electrodes TG2 and TG3 is electrically coupled to an emitter electrode EE. Herein, each of the trench gate electrodes TG2 and TG3 is formed continuously along the Y direction in plan view.

In the hybrid sub-cell region LCh1, the p-type body region PB is formed between the trench T1 and the trench T2 in order to come in contact with the gate insulating film GI formed over the internal wall of the trench T1 and the gate insulating film GI formed over the internal wall of the trench T2. In the hybrid sub-cell region LCh2, the p-type body region PB is formed between the trench T1 and the trench T3 in order to come in contact with the gate insulating film GI formed over the internal wall of the trench T1 and the gate insulating film GI formed over the internal wall of the trench T3.

On the side of the upper surface Sa of the semiconductor substrate SS in each of the hybrid sub-cell regions LCh1 and LCh2, the $n^+$-type emitter region NE is formed only on the side of the trench gate electrode TG1. That is, in the hybrid sub-cell region LCh1, the $n^+$-type emitter region NE is not formed on the side of the trench gate electrode TG2; and in the hybrid sub-cell region LCh2, the $n^+$-type emitter region NE is not formed on the side of the trench gate electrode TG3 (FIG. 1).

Further, a plurality of the $n^+$-type emitter regions NE are arranged in the Y direction so as to be spaced apart from each other by a predetermined distance (LCai), as illustrated in FIGS. 2 and 3. Accordingly, a region (cross section) where the $n^+$-type emitter region NE is not formed is also present in each of the hybrid sub-cell regions LCh1 and LCh2.

In the hybrid sub-cell region LCh1, the $n^+$-type emitter region NE is formed between the trench T1 and a contact trench CT in order to come in contact with the p-type body region PB and the gate insulating film GI formed over the internal wall of the trench T1 (side surface of the trench T1). Also, in the hybrid sub-cell region LCh2, the $n^+$-type emitter region NE is formed between the trench T1 and the contact trench CT in order to come in contact with the p-type body region PB and the gate insulating film GI formed over the internal wall of the trench T1 (side surface of the trench T1). The planar shape of the $n^+$-type emitter region NE is, for example, a rectangular shape whose width in the Y direction is LCaa and whose width in the X direction corresponds to the distance between the contact trench CT and the trench T1 (FIG. 3).

The $n^+$-type emitter region NE in the hybrid sub-cell region LCh1 is electrically coupled to the emitter electrode EE, and the $n^+$-type emitter region NE in the hybrid sub-cell region LCh2 is electrically coupled to the emitter electrode EE.

Preferably, an n-type hole barrier region (n-type semiconductor region) NHB is formed below the p-type body region PB in each of the hybrid sub-cell regions LCh1 and LCh2. In each of the hybrid sub-cell regions LCh1 and LCh2, the n-type impurity concentration of the n-type hole barrier region NHB is higher than that of the $n^-$-type drift region ND and lower than that of the $n^+$-type emitter region NE.

The n-type hole barrier region NHB in the hybrid sub-cell region LCh1 is formed between the trench T1 and the trench T2, while the n-type hole barrier region NHB in the hybrid sub-cell region LCh2 is formed between the trench T1 and the trench T3.

The n-type hole barrier region NHB in the hybrid sub-cell region LCh1 may come in contact with the p-type body region PB, the gate insulating film GI formed over the internal wall of the trench T1, and the gate insulating film GI formed over the internal wall of the trench T2. The n-type hole barrier region NHB in the hybrid sub-cell region LCh2 may come in contact with the p-type body region PB, the gate insulating film GI formed over the internal wall of the trench T1, and the gate insulating film GI formed over the internal wall of the trench T3. Thereby, the holes stored in the $n^-$-type drift region ND are less likely to be discharged into the emitter electrode EE in the hybrid sub-cell regions LCh1 and LCh2, and hence an IE effect can be enhanced.

In the inactive cell region LCi on the side of the trench T2 in the hybrid cell region LCh (left side of FIGS. 1 to 3), a p-type floating region (p-type semiconductor region) PF is provided below the p-type body region PB on the side of the upper surface Sa of the semiconductor substrate SS. The p-type floating region PF is provided between the aforementioned trench T2 and the trench T3 at the left end of each view. Inside the trench T3 at the left end of each view, the trench gate electrode TG3 is formed over the gate insulating film GI so as to fill up the trench T3. Each of the trench gate electrodes TG3 is formed continuously along the Y direction in plan view.

In the inactive cell region LCi on the side of the trench T3 in the hybrid cell region LCh (right side of each of FIGS. 1 to 3), the p-type floating region (p-type semiconductor region) PF is provided below the p-type body region PB on the side of the upper surface Sa of the semiconductor substrate SS. The p-type floating region PF is provided between the aforementioned trench T3 and the trench T2 ar the right end of each view. Inside the trench T2 at the right end of each view, the trench gate electrode TG2 is formed over the gate insulating film GI so as to fill up the trench T2. The trench gate electrode TG2 is formed continuously along the Y direction in plan view.

The trench gate electrodes TG2 and TG3, extending in the Y direction on both the sides of the inactive cell region LCi, are electrically coupled together by an end trench gate electrode TGp extending in the X direction (FIG. 2).

Further, the trench gate electrodes TG2 and TG3 on both the sides of the inactive cell region LCi are electrically coupled together by an emitter coupling portion TGx extending in the X direction. The emitter coupling portion TGx is formed, for example, integrally with the trench gate electrodes TG2 and TG3, and the thickness thereof is, for example, approximately 0.5 μm to 1.5 μm. The emitter coupling portion TGx is electrically coupled to the emitter electrode EE via the contact trench CT formed in the emitter coupling portion TGx (see FIGS. 2, 3, and 5). With such a structure, the reliability of the electrical coupling between each of the trench gate electrodes TG2 and TG3 and the emitter electrode EE can be improved without depending on a microfabrication process whose cost is unnecessarily high.

Additionally, an interlayer insulating film IL is formed over the upper surface Sa of the semiconductor substrate SS in the hybrid cell region LCh and the inactive cell region LCi (FIG. 1). The interlayer insulating film IL is formed to cover the p-type body region PB in each of the hybrid sub-cell regions LCh1 and LCh2. Herein, an insulating film IF is formed between the upper surface Sa of the semiconductor substrate SS and the interlayer insulating film IL.

The contact trench (opening) CT is formed in the interlayer insulating film IL. The contact trench (opening) CT is formed to come in contact with the $n^+$-type emitter region NE.

A $p^+$-type body contact region (p-type semiconductor region) PBC is formed in the bottom surface of the contact trench CT. Additionally, a $p^+$-type latch-up prevention region (p-type semiconductor region) PLP is formed below the $p^+$-type body contact region PBC. A $p^+$-type semiconductor region PR is formed by the $p^+$-type body contact region PBC and the $p^+$-type latch-up prevention region PLP.

The p-type impurity concentration of the $p^+$-type body contact region PBC is higher than that of the $p^+$-type latch-up prevention region PLP. The p-type impurity concentration of the $p^+$-type semiconductor region PR is higher than that of the p-type body region PB.

A coupling electrode CP is formed inside the contact trench CT. The coupling electrode CP comes in contact with the $n^+$-type emitter region NE and the $p^+$-type semiconductor region PR.

Figure 5:
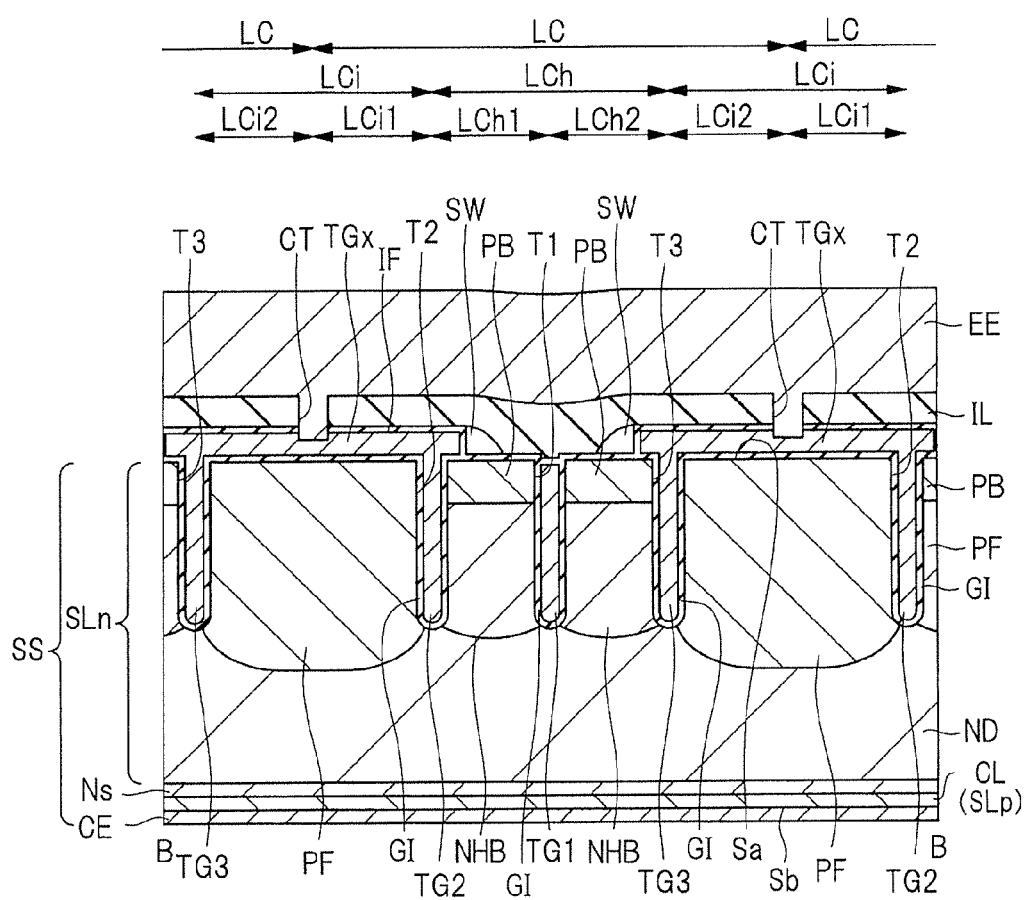
FIG. 5 is a sectional view (B-B cross section) illustrating a configuration of a semiconductor device according to an embodiment.

The contact trench (opening) CT is also formed over the emitter coupling portion TGx (see FIGS. 2, 3, and 5).

Additionally, the emitter electrode EE including a conductive film is provided over the interlayer insulating film IL, and the emitter electrode EE is coupled to the $n^+$-type emitter region NE and the $p^+$-type body contact region PBC via the contact trench CT. In the example illustrated in FIG. 1, the coupling electrode CP and the emitter electrode EE are formed integrally with each other. As described above, the emitter electrode EE is coupled to the emitter coupling portion TGx via the contact trench CT. Accordingly, the trench gate electrodes TG2 and TG3 are to be electrically coupled to the emitter electrode EE via the emitter coupling portion TGx, as described above.

Although not illustrated, an insulating film (passivation film) including, for example, a polyimide-based organic insulating film, or the like, is further formed over the emitter electrode EE, and the later-described emitter wire is coupled to the emitter electrode EE (emitter pad EP (see FIG. 4)) in a region where this insulating film is not formed.

Additionally, a p-type floating region PFp is provided in a gate wiring extraction region AR2 so as to surround a cell formation region AR1, as illustrated in FIG. 2. In FIG. 2, the p-type floating regions PFp and PF are indicated by the regions where hatching lines are attached. The p-type floating region PFp is electrically coupled to the emitter electrode EE via a portion of the $p^+$-type body contact region PBCp exposed at the bottom surface of the contact trench CT.

In the present embodiment, the contact trench CT, which comes in contact with the $n^+$-type emitter region NE, extends in the Y direction, but is not formed continuously, unlike, for example, the trench gate electrode TG1 (FIGS. 2 and 3). In other words, the contact trench CT that comes in contact with the $n^+$-type emitter region NE is arranged by being divided. By thus arranging the contact trench CT that comes in contact with the n'-type emitter region NE by dividing it so as to avoid the crossing region between the hybrid cell region LCh and the extended region of the emitter coupling portion TGx, a contact trench processing defect, resulting from the concavities and convexities formed due to the emitter coupling portion TGx, can be avoided.

Further, a spacer SW including, for example, a polycrystalline silicon film is formed over the sidewall of the emitter coupling portion TGx via the insulating film IF, as illustrated in FIGS. 3 and 5. FIG. 5 is a sectional view illustrating the configuration of the semiconductor device according to the present embodiment. FIG. 5 corresponds, for example, to the B-B cross section in FIG. 3. The crossing region between the hybrid cell region LCh and the extended region of the emitter coupling portion TGx corresponds, for example, to the region surrounded by the dashed line in FIG. 2.

The thickness of the emitter coupling portion TGx is, for example, approximately 0.5 μm to 1.5 μm; however, by forming the spacer SW over the sidewall of the emitter coupling portion TGx, each of the surface of the interlayer insulating film IL formed over the emitter coupling portion TGx and the surface of the emitter electrode EE formed over the interlayer insulating film IL can be caused to have a gentle shape at the end of the emitter coupling portion TGx. The aforementioned spacer SW includes, for example, a polycrystalline silicon film. The polycrystalline silicon film can be formed simultaneously when a polycrystalline silicon film, which forms, for example, a protective diode, a temperature detection diode, a resistance, a fuse, or the like, is formed.

Figure 6:
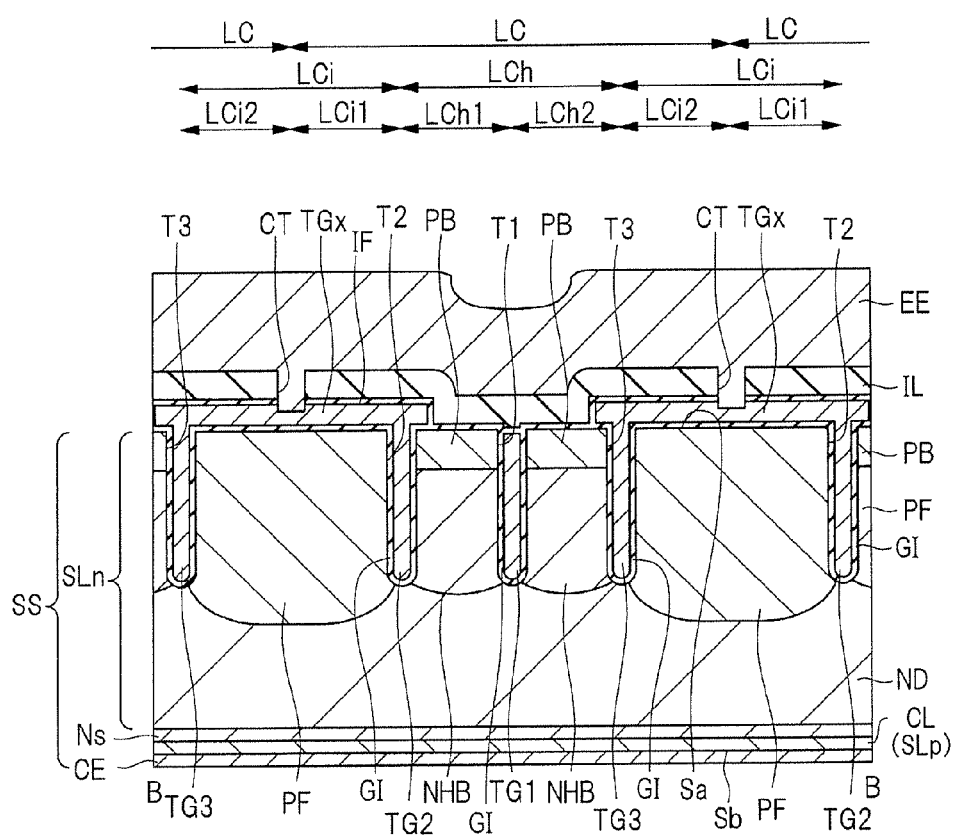
FIG. 6 is a sectional view (B-B cross section) illustrating a configuration of a semiconductor device according to a comparative example.

FIG. 6 is a sectional view illustrating a configuration of a semiconductor device according to a comparative example, in which the spacer SW is not formed over the sidewall of the emitter coupling portion TGx. FIG. 6 corresponds to the B-B cross section in which the spacer SW illustrated, for example, in FIG. 3 is not formed.

When the spacer SW is not formed, the upper portion at the end of the emitter coupling portion TGx has an acute angle. Accordingly, there is the risk that, when an emitter wire is coupled to the emitter electrode EE (emitter pad EP (see FIG. 4)), stress may be concentrated in an acute angle portion of the emitter coupling portion TGx, whereby a crack may be caused. In particular, a large load is applied to an emitter wire having a diameter of 500 μm or more in the case of an IGBT, etc., for large current use, and hence stress is likely to be concentrated in an acute angle portion of the emitter coupling portion TGx.

Also, concavities and convexities (level differences) are formed in the surface of the emitter electrode EE formed over the interlayer insulating film IL, following the level difference at the end of the emitter coupling portion TGx. If concavities and convexities are present in the surface of the emitter electrode EE, the power applied when an emitter wire is coupled is likely to be lost, whereby there is the problem that the adhesiveness between the emitter electrode EE (emitter pad EP) and the emitter wire may be deteriorated.

So, the spacer SW is formed over the sidewall of the emitter coupling portion TGx in the present embodiment. By forming the spacer SW, stress is dispersed, not concentrated in an acute angle portion of the emitter coupling portion TGx when an emitter wire is coupled to the emitter electrode EE (emitter pad EP), and hence occurrence of a crack can be suppressed. Further, by forming the spacer SW, the concavities and convexities to be formed in the surface of the emitter electrode EE (emitter pad EP) can be reduced, whereby the adhesiveness between the emitter electrode EE and the emitter wire can be improved. Thereby, the yield and reliability of a semiconductor device can be improved.

<<Manufacturing Method of IE-Type Trench Gate IGBT>>

A manufacturing method of the IE-type trench gate IGBT according to the present embodiment and a protective diode will be described with reference to FIGS. 7 to 38. FIGS. 7 to 38 are essential-part sectional views each illustrating a manufacturing step of the IE-type trench gate IGBT according to the embodiment (A-A, B-B cross section illustrated in FIG. 3) or a protective diode.

Figure 7:
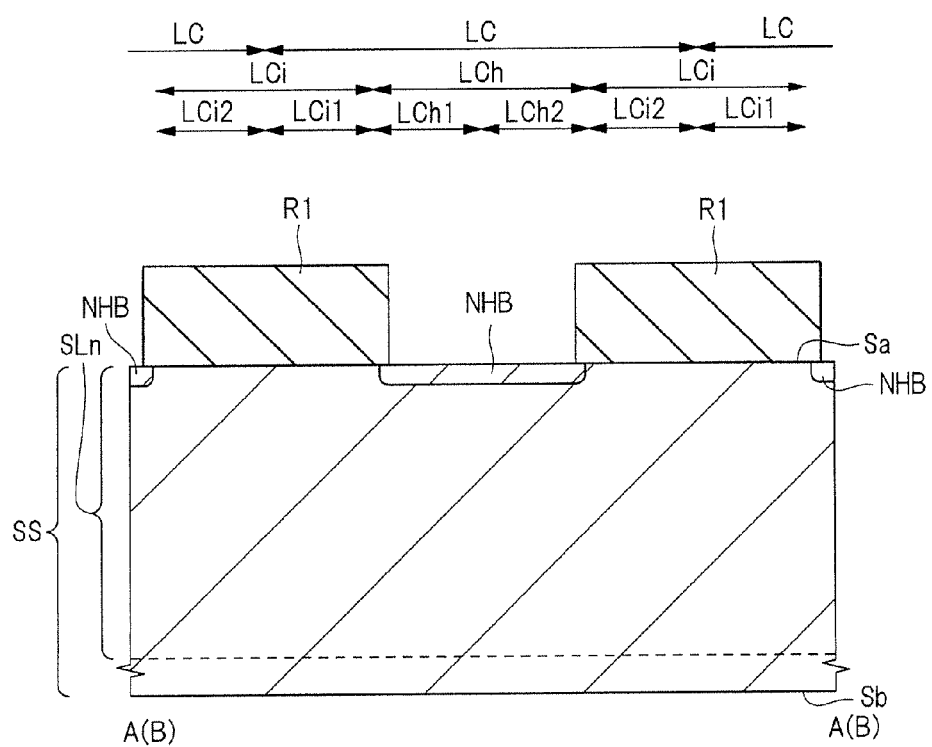
FIG. 7 is an essential-part sectional view (A-A, B-B cross section) illustrating a manufacturing step of an IGBT according to an embodiment.

As illustrated in FIG. 7 (A-A, B-B cross section), the semiconductor substrate SS, including, for example, a silicon single crystal into which n-type impurities, such as, for example, phosphorus (P), have been introduced, is first provided. The semiconductor substrate SS has the upper surface Sa as a first main surface and the lower surface Sb as a second main surface, the lower surface Sb being opposite to the upper surface Sa.

The semiconductor substrate SS contains n-type impurities. The concentration of the impurities is, for example, approximately $2 \times 10^{14}$ cm$^{-3}$. At this stage, the semiconductor substrate SS is a semiconductor thin plate whose planar shape is an approximate circle, the thin plate being referred to as a wafer. The thickness of the semiconductor substrate SS is, for example, approximately 450 μm to 1000 μm. The layer extending from the upper surface Sa of the semiconductor substrate SS to a predetermined depth serves as the semiconductor layer SLn.

Subsequently, a resist film R1 (photoresist film) for introducing an n-type hole barrier region is formed over the whole upper surface Sa of the semiconductor substrate SS by coating, or the like, and then the resist film R1 having an opening in the hybrid cell region LCh is formed by patterning using ordinary photolithography (exposure and development). The n-type hole barrier region NHB is formed by introducing n-type impurities into the upper surface Sa of the semiconductor substrate SS with the use, for example, of ion injection using the resist film R1 as a mask. As the ion injection conditions in this case, the following conditions can be exemplified as preferred ones, in which: an ionic species is, for example, phosphorus (P); a dose amount is approximately $6 \times 10^{12}$ cm$^{-2}$; and injection energy is approximately 80 KeV. Thereafter, the resist film R1 that has become unnecessary is removed by ashing, or the like.

Figure 8:
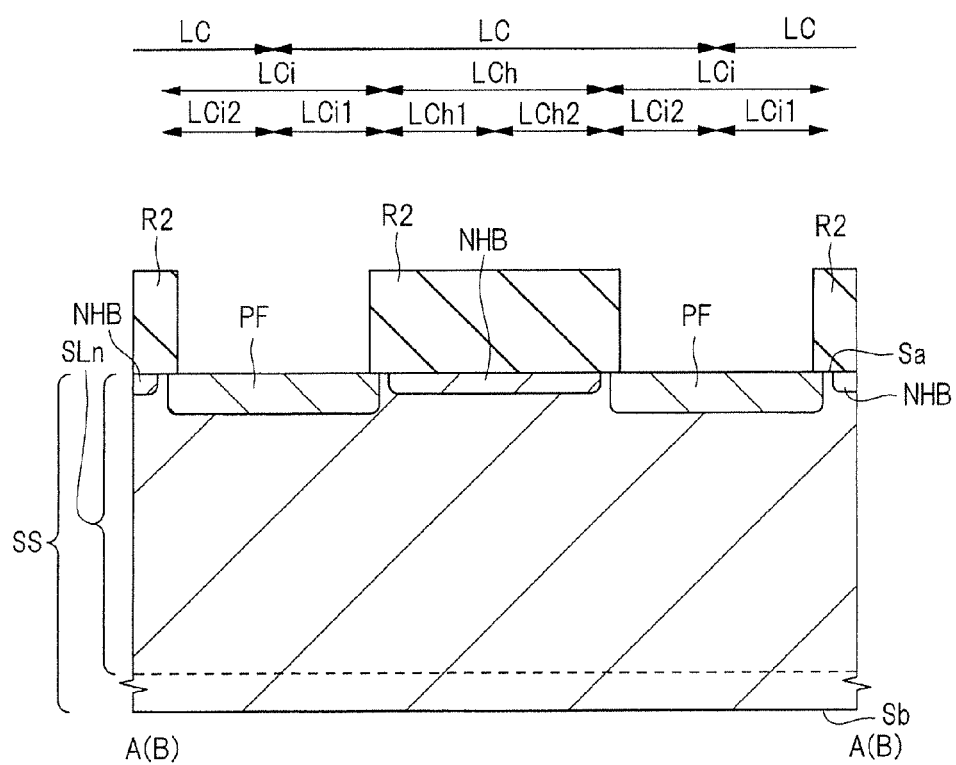
FIG. 8 is an essential-part sectional view (A-A, B-B cross section) illustrating a manufacturing step of an IGBT, following FIG. 7.

Subsequently, a resist film R2 for introducing a p-type floating region is formed over the upper surface Sa of the semiconductor substrate SS by coating, or the like, and then the resist film R2 having an opening in the inactive cell region LCi is formed by patterning using ordinary photolithography, as illustrated in FIG. 8 (A-A, B-B cross section). The p-type floating region PF is formed by introducing p-type impurities into the upper surface Sa of the semiconductor substrate SS with the use, for example, of ion injection using the resist film R2 as a mask. As the ion injection conditions in this case, the following ion injection conditions can be exemplified as preferred ones, in which: an ionic species is, for example, boron (B); a dose amount is approximately $3.5 \times 10^{13}$ cm$^{-2}$; and injection energy is approximately 75 KeV. Thereafter, the resist film R2 that has become unnecessary is removed by ashing, or the like. When the p-type floating region PF is formed in the cell formation region AR1 (see FIG. 2), the p-type floating region PFp is formed, for example, in the outermost portion of the gate wiring extraction region AR2 (see FIG. 2).

Figure 9:
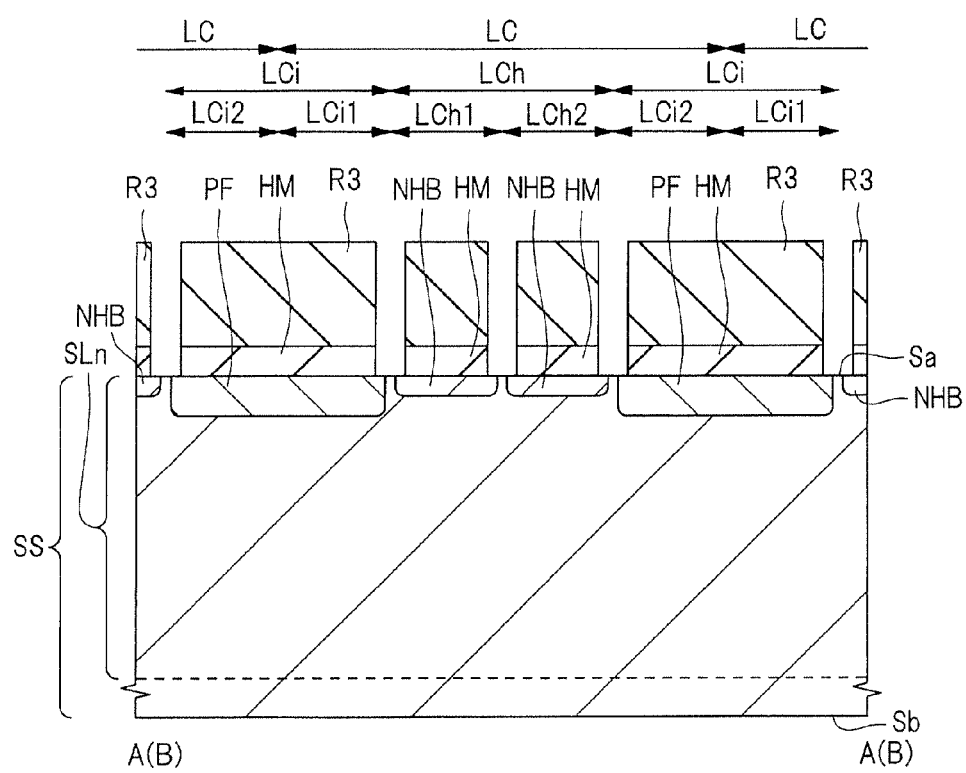
FIG. 9 is an essential-part sectional view (A-A, B-B cross section) illustrating a manufacturing step of an IGBT, following FIG. 8.

Subsequently, a hard mask film HM including, for example, silicon oxide is formed over the upper surface Sa of the semiconductor substrate SS by using, for example, a CVD (Chemical Vapor Deposition) process, or the like, as illustrated in FIG. 9 (A-A, B-B cross section). The thickness of the hard mask film HM is, for example, approximately 450 nm.

Subsequently, a resist film R3 for processing a hard mask film is formed over the upper surface Sa of the semiconductor substrate SS by coating, or the like, and then the resist film R3 having an opening in a trench (T1 to T3) formation region is formed by patterning using ordinary photolithography. The hard mask film HM is patterned, for example, by dry etching using the resist film R3 as a mask.

Figure 10:
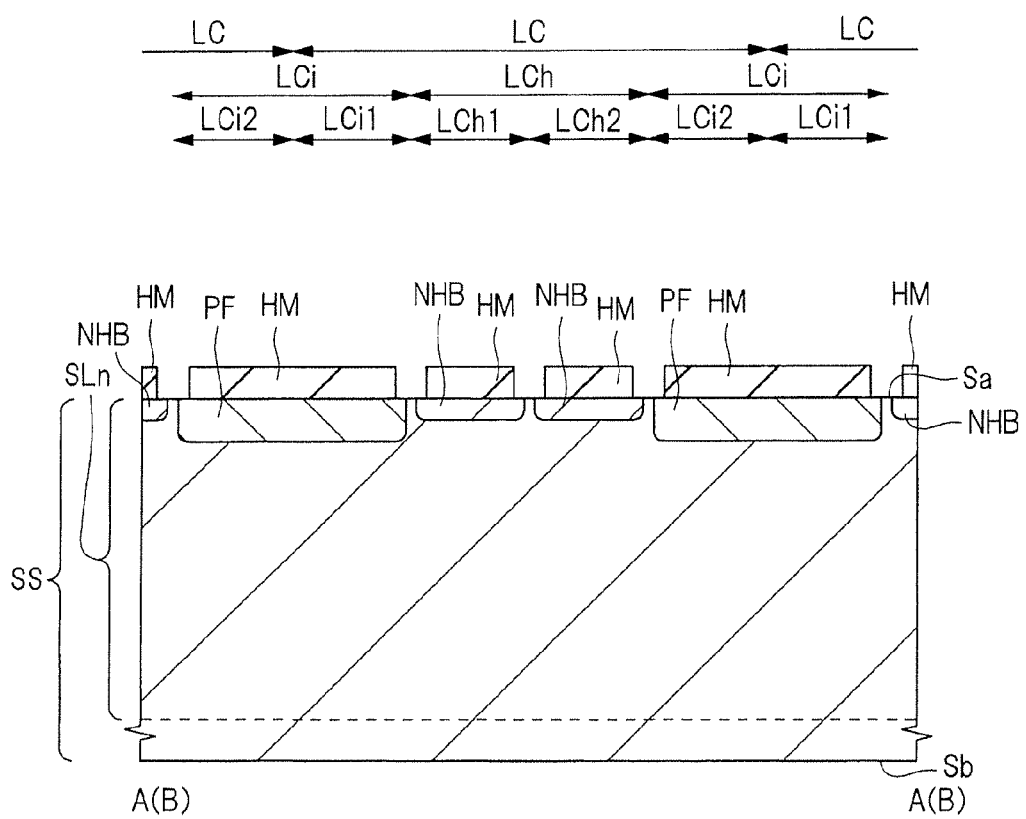
FIG. 10 is an essential-part sectional view (A-A, B-B cross section) illustrating a manufacturing step of an IGBT, following FIG. 9.

Thereafter, the resist film R3 that has become unnecessary is removed by ashing, or the like, as illustrated in FIG. 10 (A-A, B-B cross section).

Figure 11:
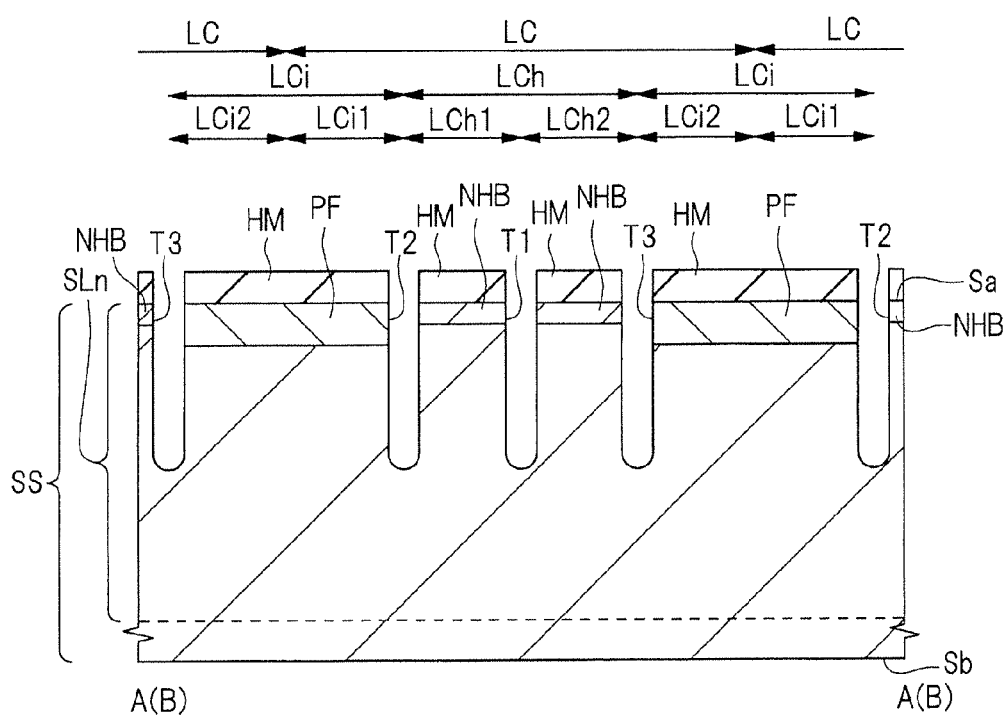
FIG. 11 is an essential-part sectional view (A-A, B-B cross section) illustrating a manufacturing step of an IGBT, following FIG. 10.

Subsequently, the trenches T1, T2, and T3 are formed, for example, by anisotropic dry etching using the remaining hard mask film HM, as illustrated in FIG. 11 (A-A, B-B cross section). At the time, the trench T1, which reaches the middle of the semiconductor layer SLn from the upper surface Sa of the semiconductor substrate SS and extends in the Y direction in plan view, is formed. Also, the trenches T2 and T3, each of which reaches the middle of the semiconductor layer SLn from the upper surface Sa of the semiconductor substrate SS and which are arranged on both the sides of the trench T1 so as sandwich it and each of which extends in the Y direction in plan view, are formed. As the gas for the anisotropic dry etching, for example, $Cl_2/O_2$-based gas can be exemplified as preferred one.

Figure 12:
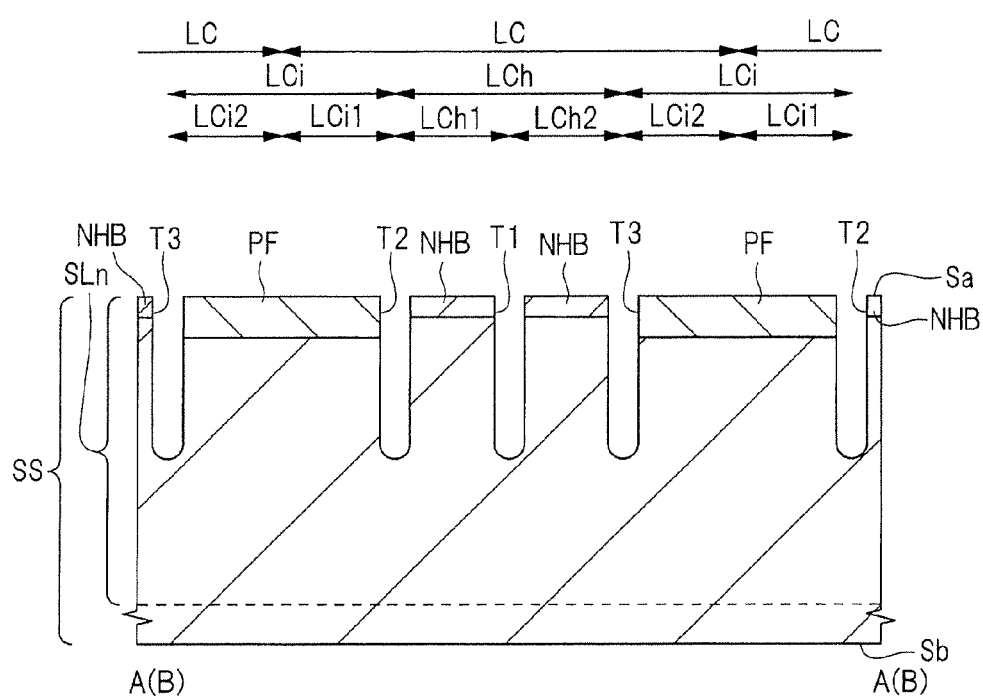
FIG. 12 is an essential-part sectional view (A-A, B-B cross section) illustrating a manufacturing step of an IGBT, following FIG. 11.

Thereafter, the hard mask film HM that has become unnecessary is removed by wet etching using, for example, a hydrofluoric acid-based etching solution, or the like, as illustrated in FIG. 12 (A-A, B-B cross section).

Figure 13:
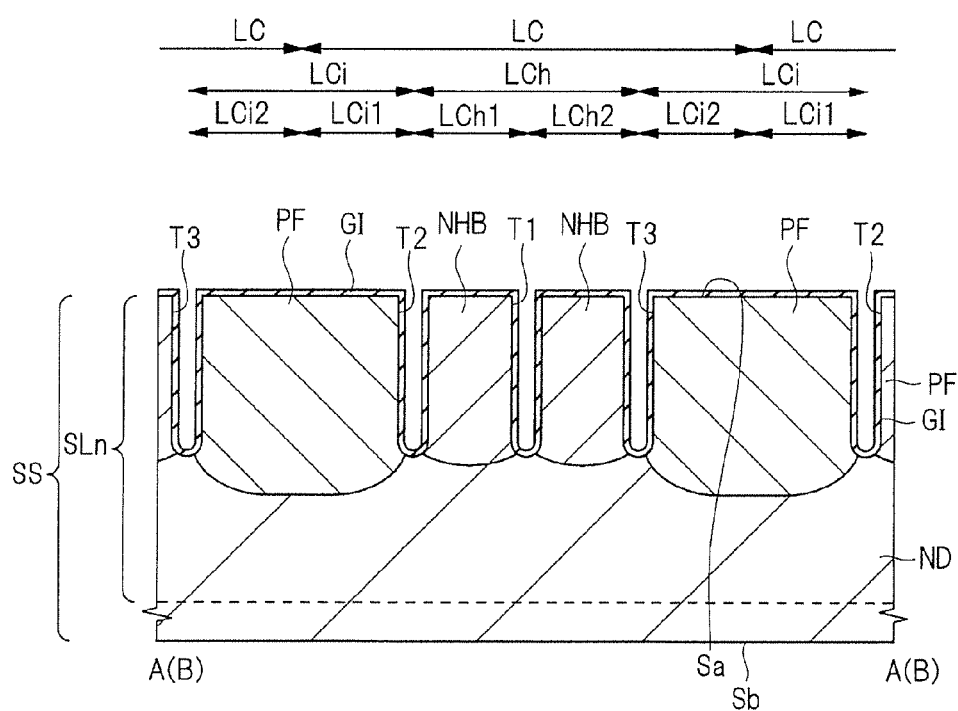
FIG. 13 is an essential-part sectional view (A-A, B-B cross section) illustrating a manufacturing step of an IGBT, following FIG. 12.

Subsequently, the p-type floating region PF and the n-type hole barrier region NHB are subjected to enlargement diffusion (e.g., 1200° C., approximately 30 minutes), as illustrated in FIG. 13 (A-A, B-B cross section). In this case, the enlargement diffusion is performed such that the lower surface of the p-type floating region PF becomes lower than the lower surface of each of the trenches T1, T2, and T3.

Subsequently, the gate insulating film GI including, for example, silicon oxide is formed over the upper surface Sa of the semiconductor substrate SS and over the internal wall of each of the trenches T1, T2, and T3, by using, for example, a thermal oxidation process, or the like. The thickness of the gate insulating film GI is, for example, approximately 0.12 μm.

By the aforementioned enlargement diffusion, the p-type floating regions PF are formed between the trench T3 at the left end of FIG. 13 and the adjacent trench T2, and between the trench T2 at the right end of FIG. 13 and the adjacent trench T3. Preferably, each of the p-type floating regions PF comes in contact with the gate insulating film GI formed over the internal wall of the trench T2 and the gate insulating film GI formed over the internal wall of the trench T3.

The n-type hole barrier regions NHB are formed between the trench T1 and the adjacent trench T2 and between the trench T1 and the adjacent trench T3. Preferably, the n-type hole barrier region NHB formed between the trench T1 and the trench T2 comes in contact with the gate insulating film GI formed over the internal wall of the trench T1 and the gate insulating film GI formed over the internal wall of the trench T2. Preferably, the n-type hole barrier region NHB formed between the trench T1 and the trench T3 comes in contact with the gate insulating film GI formed over the internal wall of the trench T1 and the gate insulating film GI formed over the internal wall of the trench T3.

Of the n-type semiconductor substrate SS, a region, in which the p-type floating region PF and the n-type hole barrier region NHB are not formed when the aforementioned enlargement diffusion is performed, serves as the n$^-$-type drift region ND. In other words, of the n-type semiconductor layer SLn, a region, in which the p-type floating region PF and the n-type hole barrier region NHB are not formed, serves as the n$^-$-type drift region ND. In the step illustrated in FIG. 13, the n$^-$-type drift region ND is formed to extend from the inside of the semiconductor layer SLn to the lower surface Sb of the semiconductor substrate SS.

Between the trench T1 and the trench T2, the n-type impurity concentration of the n-type hole barrier region NHB is higher than that of the n$^-$-type drift region ND and lower than that of the later-described n$^+$-type emitter region NE. The same is true between the trench T1 and the trench T3.

Figure 14:
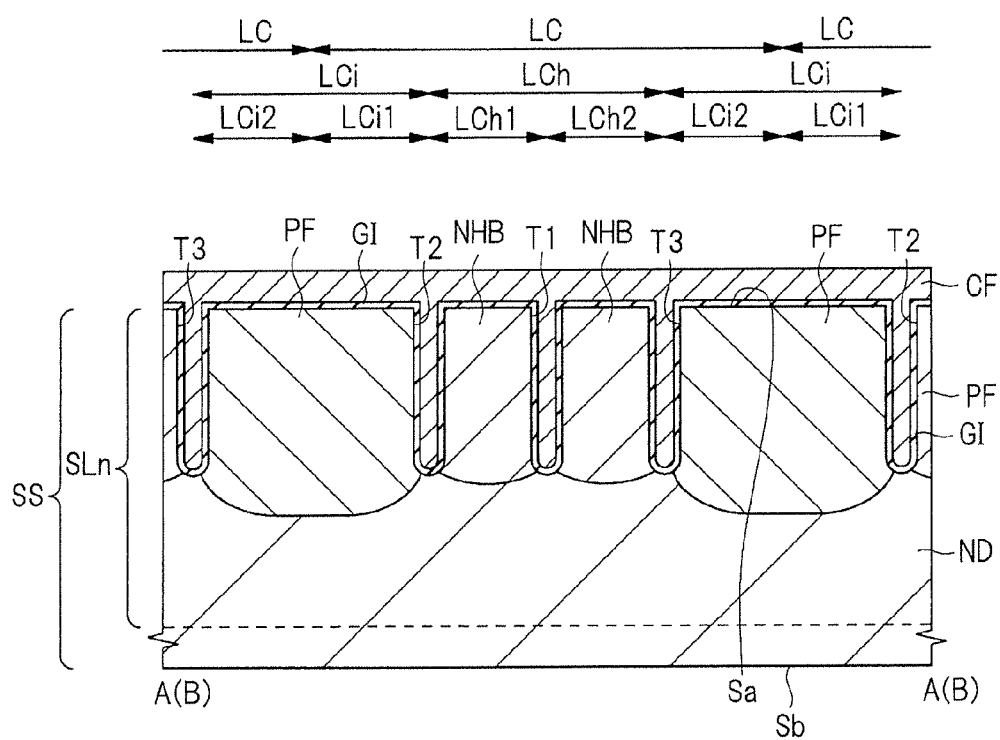
FIG. 14 is an essential-part sectional view (A-A, B-B cross section) illustrating a manufacturing step of an IGBT, following FIG. 13.

Subsequently, a conductive film CF, including polycrystalline silicon (Doped Poly-Silicon) into which phosphorus (P) has been doped, is formed over the upper surface Sa of the semiconductor substrate SS and inside the trenches T1, T2, and T3 by using, for example, a CVD process, or the like, as illustrated in FIG. 14 (A-A, B-B cross section). The thickness of the conductive film CF is, for example, approximately 0.5 μm to 1.5 μm.

Figure 15:
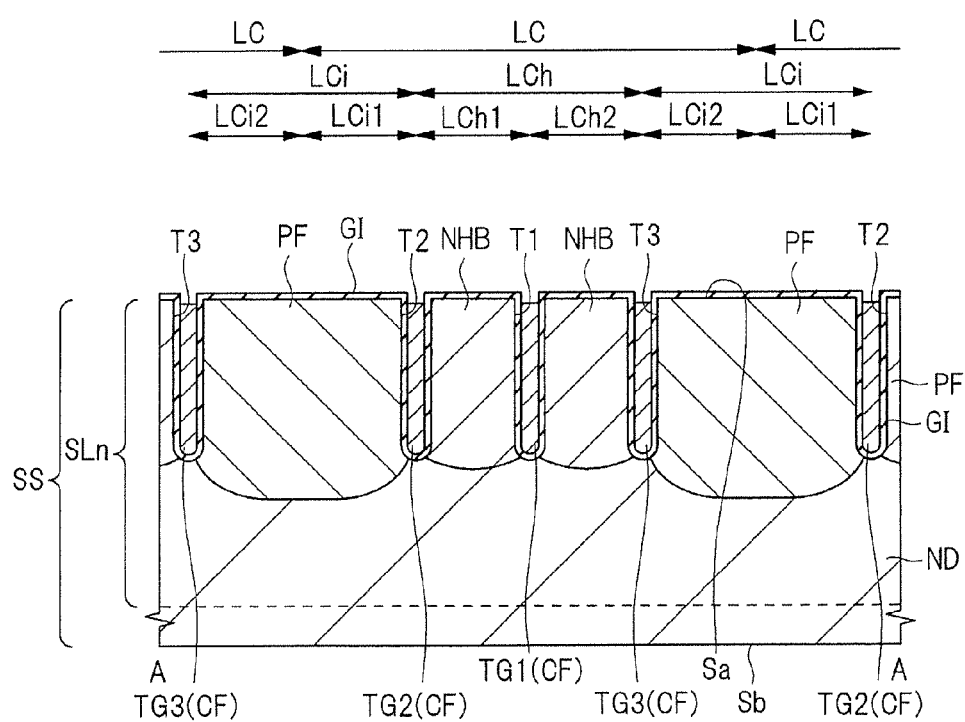
FIG. 15 is an essential-part sectional view (A-A cross section) illustrating a manufacturing step of an IGBT, following FIG. 14.
Figure 16:
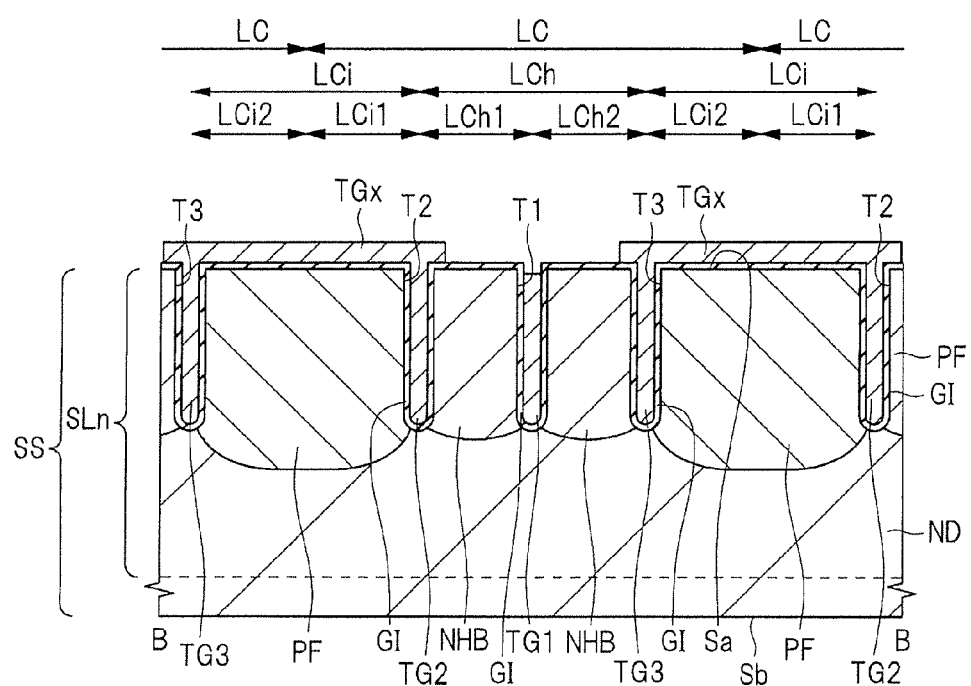
FIG. 16 is an essential-part sectional view (B-B cross section) illustrating a manufacturing step of an IGBT, following FIG. 14.

Subsequently, the conductive film CF is patterned by using, for example, dry etching, or the like, as illustrated in FIG. 15 (A-A cross section) and FIG. 16 (B-B cross section). A resist film covering at least an emitter coupling portion formation region (not illustrated) is formed, for example, by photolithography such that the conductive film CF is patterned by using this resist film as a mask. In this case, etching conditions are adjusted such that the conductive film CF remains inside the trenches T1, T2, and T3 (etchbacked).

Thereby, the trench gate electrode TG1, including the conductive film CF embedded inside the trench T1 via the gate insulating film GI, is formed. Also, the trench gate electrode TG2, including the conductive film CF embedded inside the trench T2 via the gate insulating film GI, is formed. Also, the trench gate electrode TG3, including the conductive film CF embedded inside of the trench T3 via the gate insulating film GI, is formed. Further, the emitter coupling portion TGx is formed. The emitter coupling portion TGx couples together the trench gate electrodes TG2 and TG3, which are adjacent to each other to sandwich the p-type floating region PF, and is formed integrally with the trenches. The thickness of the emitter coupling portion TGx is, for example, approximately 0.5 μm to 1.5 μm.

In other words, the trench gate electrode TG1 is formed over the gate insulating film GI so as to fill up the trench T1, and the trench gate electrode TG2 is formed over the gate insulating film GI so as to fill up the trench T2, and the trench gate electrode TG3 is formed over the gate insulating film GI so as to fill up the trench T3. Further, the emitter coupling portion TGx, which crosses the upper surfaces of the trench gate electrodes TG2 and TG3 adjacent to each other to sandwich the p-type floating region PF, is formed. As the gas for this etching, for example, SF$_6$ gas, etc., can be exemplified as preferred ones. Thereafter, the resist film that has become unnecessary is removed by aching, or the like.

Figure 17:
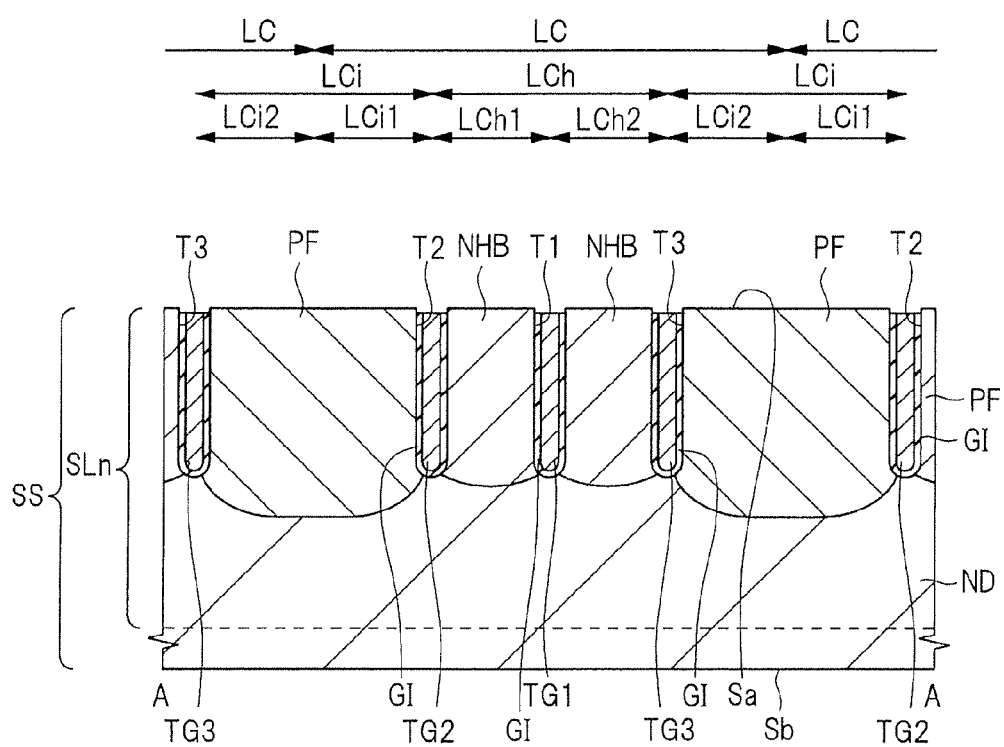
FIG. 17 is an essential-part sectional view (A-A cross section) illustrating a manufacturing step of an IGBT, following FIGS. 15 and 16.
Figure 18:
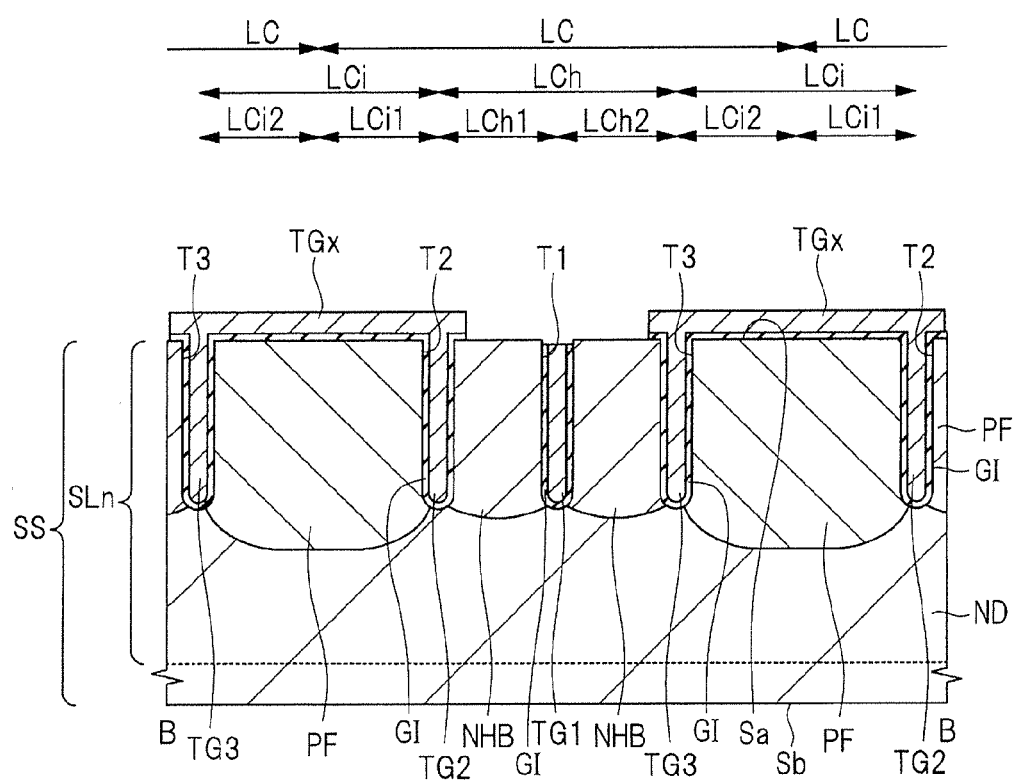
FIG. 18 is an essential-part sectional view (B-B cross section) illustrating a manufacturing step of an IGBT, following FIGS. 15 and 16.

Subsequently, the gate insulating film GIs, other than those present inside the trenches T1, T2, and T3 and covered with the emitter coupling portion TGx, is removed by dry etching, or the like, as illustrated in FIG. 17 (A-A cross section) and FIG. 18 (B-B cross section).

Figure 19:
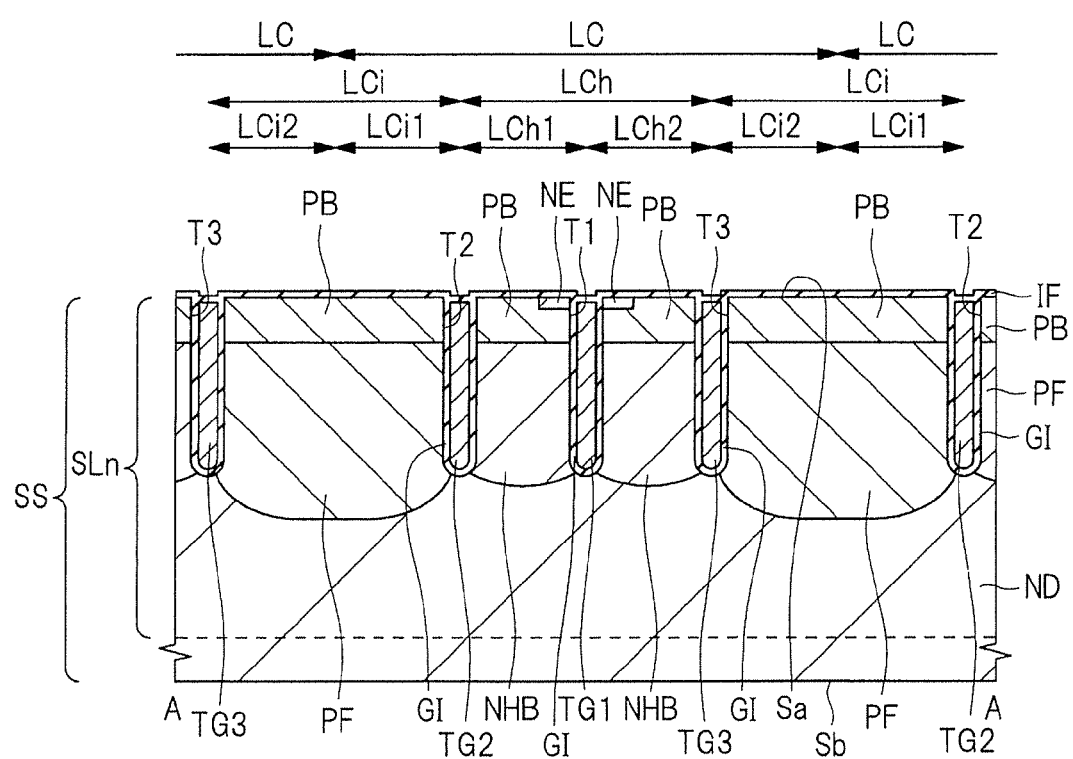
FIG. 19 is an essential-part sectional view (A-A cross section) illustrating a manufacturing step of an IGBT, following FIGS. 17 and 18.
Figure 20:
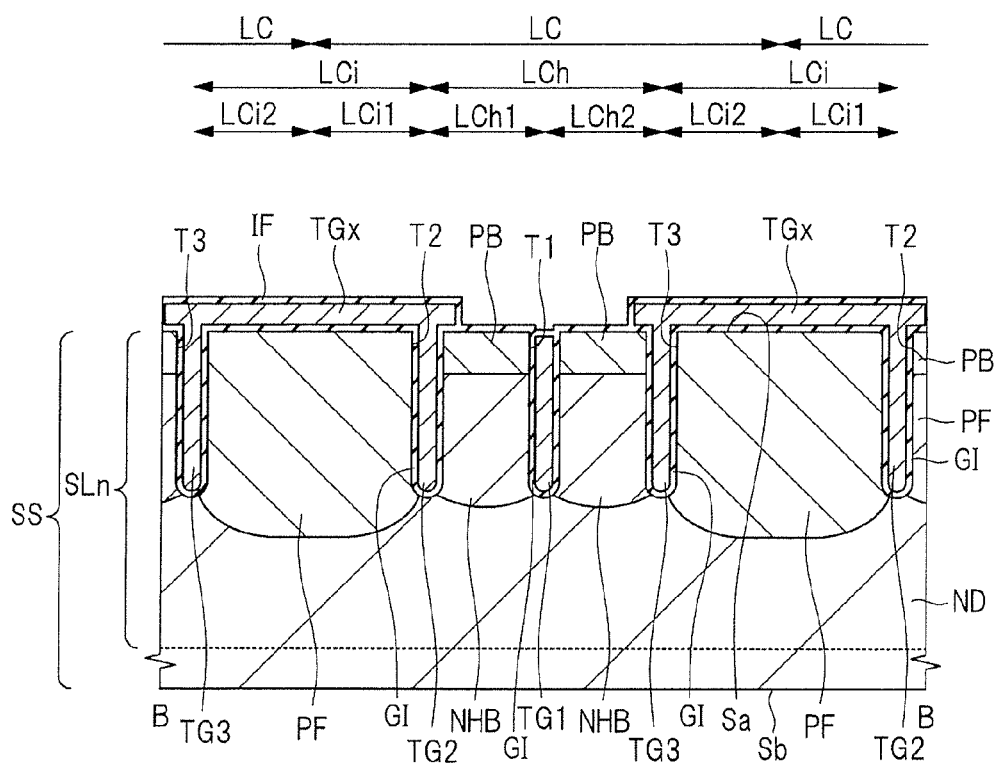
FIG. 20 is an essential-part sectional view (B-B cross section) illustrating a manufacturing step of an IGBT, following FIGS. 17 and 18.

Subsequently, the insulating film IF including a relatively thin silicon oxide film (the thickness is almost the same as, for example, the gate insulating film GI) is formed over the upper surface Sa of the semiconductor substrate SS and over the upper surface and the side surface of the emitter coupling portion TGx by using, for example, a thermal oxidation process, a CVD process, or the like, as illustrated in FIG. 19 (A-A cross section) and FIG. 20 (B-B cross section).

Figure 21:
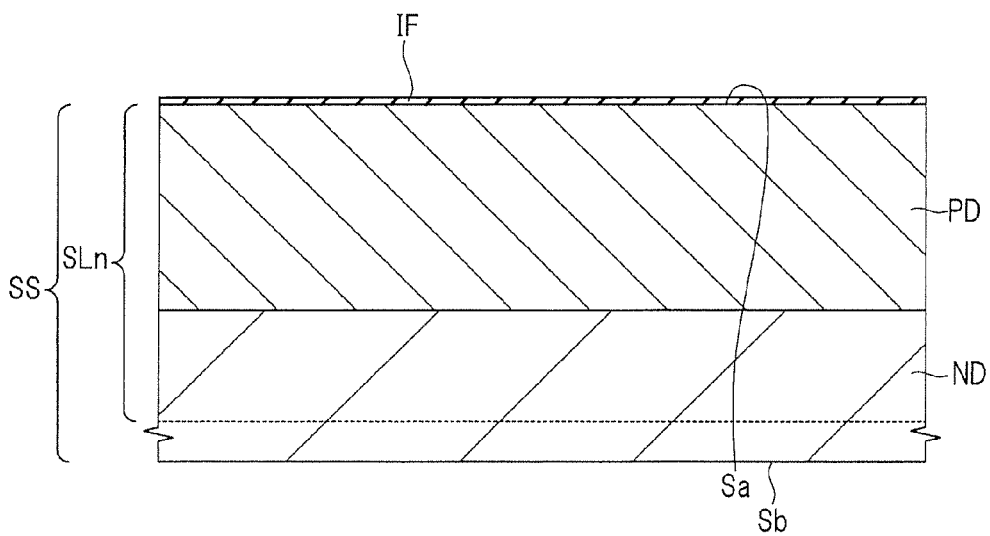
FIG. 21 is an essential-part sectional view illustrating a manufacturing step of a protective diode, following FIGS. 17 and 18.

The insulating film IF is also formed over the upper surface Sa of the semiconductor substrate SS in a region where a protective diode is to be formed, as illustrated in FIG. 21 (cross section of protective diode). Herein, a p-type layer PD is already formed in the semiconductor substrate SS in the region where the protective diode is to be formed. The p-type layer PD of the protective diode can be formed simultaneously, for example, when the p-type floating region PF of the IE-type trench gate IGBT is formed.

Subsequently, a resist film for introducing a p-type body region (not illustrated) is formed over the upper surface Sa of the semiconductor substrate SS by ordinary photolithography. The p-type body region PB is formed by introducing p-type impurities into the whole surface of the cell formation region AR1 (see FIG. 2) and into other necessary portions by using, for example, ion injection with the use of the resist film for introducing a p-type body region as a mask.

Specifically, the p-type body region PB, which comes in contact with the gate insulating film GI formed over the internal wall of the trench T1 and the gate insulating film GI formed over the internal wall of the trench T2, is formed between the trench T1 and the trench T2. Also, the p-type body region PB, which comes in contact with the gate insulating film GI formed over the internal wall of the trench T1 and the gate insulating film GI formed over the internal wall of the trench T3, is formed between the trench T1 and the trench T3. The p-type body region PB is formed over the n-type hole barrier region NHB. Also, the p-type body region PB is formed over the p-type floating region PF in the inactive cell region LCi.

As the ion injection conditions in this case, the following conditions can be exemplified as preferred ones, in which: an ionic species is, for example, boron (B); a dose amount is approximately $3\times10^{13}$ cm$^{-2}$; and injection energy is approximately 75 KeV. Thereafter, the resist film for introducing a p-type body region that has become unnecessary is removed by asking, or the like.

A resist film for introducing an n$^+$-type emitter region (not illustrated) is formed over the upper surface Sa of the semiconductor substrate SS by ordinary photolithography. The n$^+$-type emitter region NE is formed by introducing n-type impurities into the upper portion of the p-type body region PB in the hybrid cell region LCh by using, for example, ion injection with the use of the resist film for introducing an n$^+$-type emitter region as a mask. As the ion injection conditions in this case, the following conditions can be exemplified as preferred ones, in which: an ionic species is, for example, arsenic (As); a dose amount is approximately $5\times10^{15}$ cm$^{-2}$; and injection energy is approximately 80 KeV.

The n$^+$-type emitter region NE is formed only on the side of the trench gate electrode TG1 in the hybrid sub-cell regions LCh1 and LCh2. Specifically, the n$^+$-type emitter region NE, which comes in contact with both the gate insulating film GI formed over the internal wall of the trench T1 and the p-type body region PB, is formed between the trench T1 and the trench T2. Also, the n$^+$-type emitter region NE, which comes in contact with both the gate insulating film GI formed over the internal wall of the trench T1 and the p-type body region PB, is formed between the trench T1 and the trench T3. Thereafter, the resist film for introducing an $n^+$-type emitter region that has become unnecessary is removed by asking, or the like.

Figure 22:
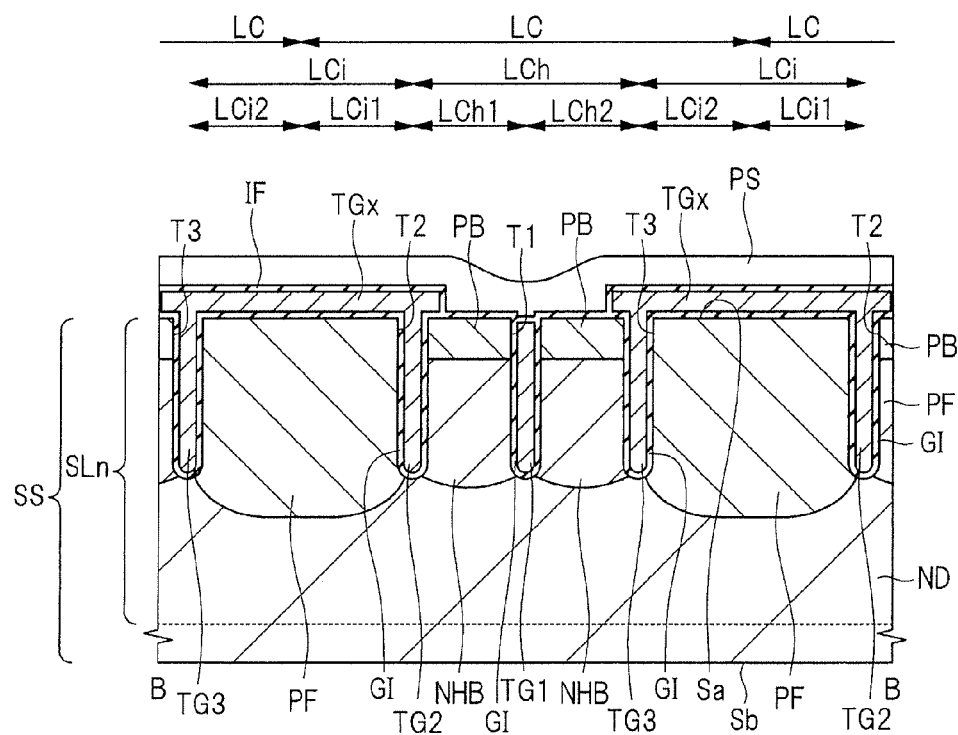
FIG. 22 is an essential-part sectional view (B-B cross section) illustrating a manufacturing step of an IGBT, following FIGS. 19 to 21.
Figure 23:
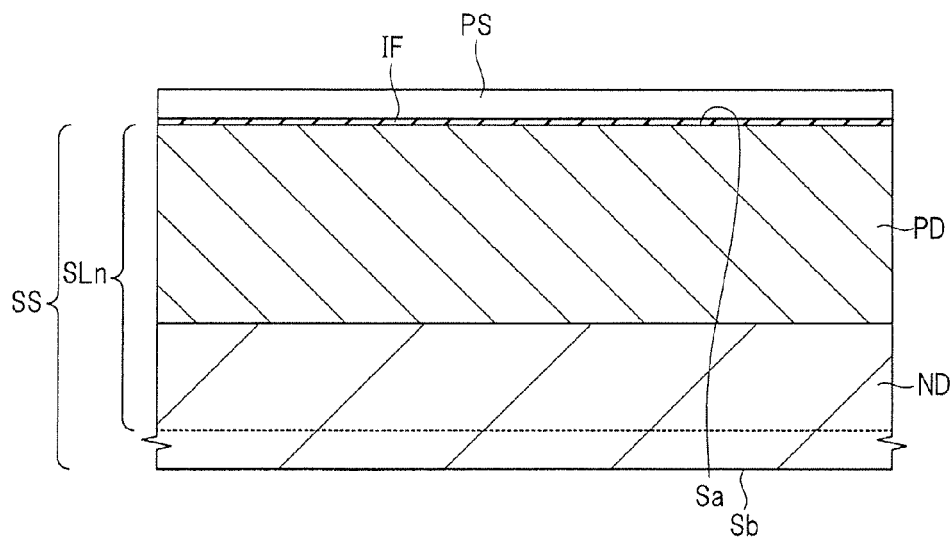
FIG. 23 is an essential-part sectional view illustrating a manufacturing step of a protective diode, following FIGS. 19 to 21.

Subsequently, an intrinsic semiconductor film PS including non-doped polycrystalline silicon is formed over the upper surface Sa of the semiconductor substrate SS by using, for example, a CVD process, or the like, as illustrated in FIG. 22 (B-B cross section) and FIG. 23 (cross section of protective diode).

Figure 24:
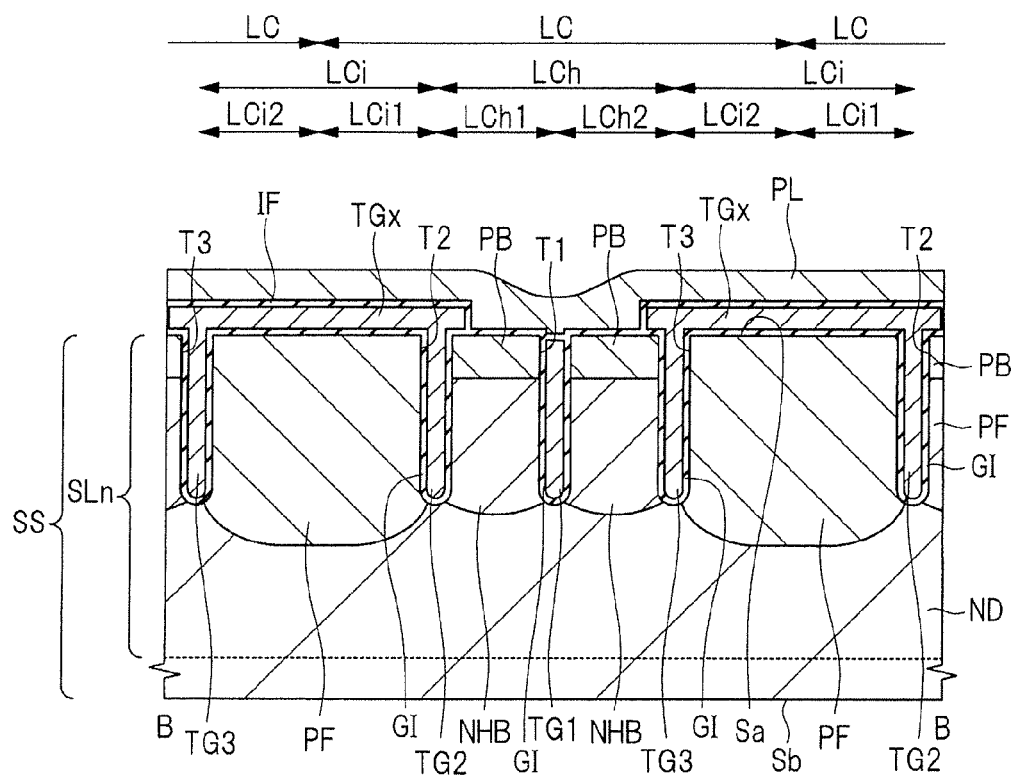
FIG. 24 is an essential-part sectional view (B-B cross section) illustrating a manufacturing step of an IGBT, following FIGS. 22 and 23.
Figure 25:
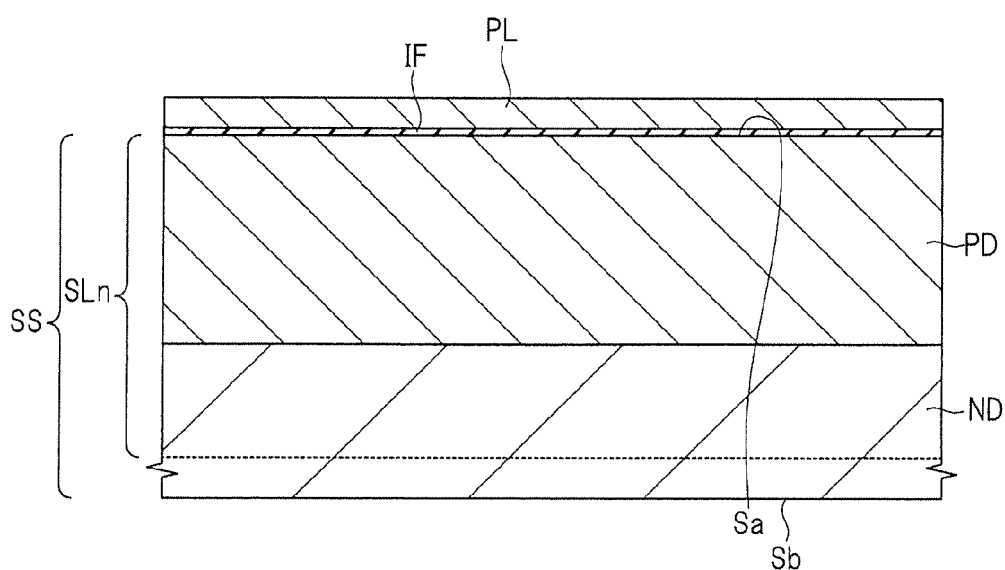
FIG. 25 is an essential-part sectional view illustrating a manufacturing step of a protective diode, following FIGS. 22 and 23.

Subsequently, a $p^-$-type layer PL is formed by introducing p-type impurities into the intrinsic semiconductor film PS by using, for example, ion injection, as illustrated in FIG. 24 (B-B cross section) and FIG. 25 (cross section of protective diode). As the ion injection conditions in this case, the following conditions can be exemplified as preferred ones, in which: anionic species is, for example, boron (B); a dose amount is approximately $1 \times 10^{14}$ cm$^{-2}$; and injection energy is approximately 50 KeV.

Figure 26:
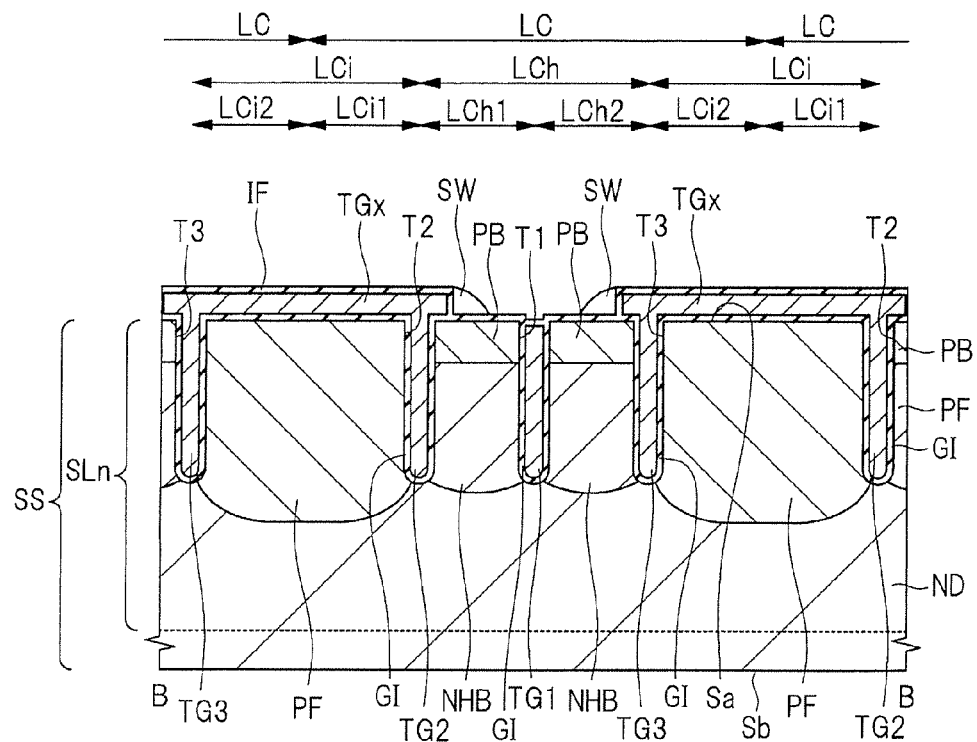
FIG. 26 is an essential-part sectional view (B-B cross section) illustrating a manufacturing step of an IGBT, following FIGS. 24 and 25.
Figure 27:
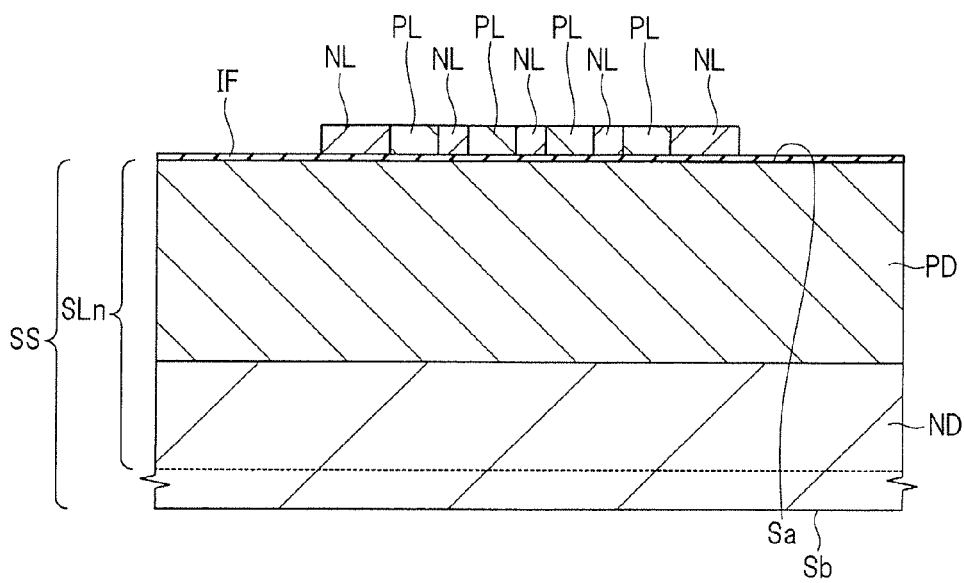
FIG. 27 is an essential-part sectional view illustrating a manufacturing step of a protective diode, following FIGS. 24 and 25.

Subsequently, a resist film for forming a protective diode (not illustrated) is formed in a region where the protective diode is to be formed over the upper surface Sa of the semiconductor substrate SS by ordinary photolithography, as illustrated in FIG. 26 (B-B cross section) and FIG. 27 (cross section of protective diode). The $p^-$-type layer PL is patterned by using, for example, anisotropic dry etching, or the like, with the use of the resist film for forming a protective diode as a mask. Simultaneously, the spacer SW is formed over the sidewall of the emitter coupling portion TGx via the insulating film IF. As the etching gas in this case, for example, $SF_6$ gas, etc., can be exemplified as preferred ones. Thereafter, the resist film for forming a protective diode that has become unnecessary is removed by ashing, or the like.

Subsequently, a resist film for introducing an $n^+$-type layer (not illustrated) is formed over the upper surface Sa of the semiconductor substrate SS by ordinary photolithography. The $n^+$-type layer NL is formed by introducing n-type impurities into the $p^-$-type layer PL by using, for example, ion injection with the use of the resist film for introducing an $n^+$-type layer as a mask. As the ion injection conditions in this case, the following conditions can be exemplified as preferred ones, in which: an ionic species is, for example, arsenic (As); a dose amount is approximately $5 \times 10^{15}$ cm$^{-2}$; and injection energy is approximately 80 KeV. Thereby, a multi-stage protective diode, in which the $p^-$-type layers PL and $n^+$-type layers are alternately formed, is formed. Thereafter, the resist film for introducing an $n^+$-type layer that has become unnecessary is removed by ashing, or the like.

Figure 28:
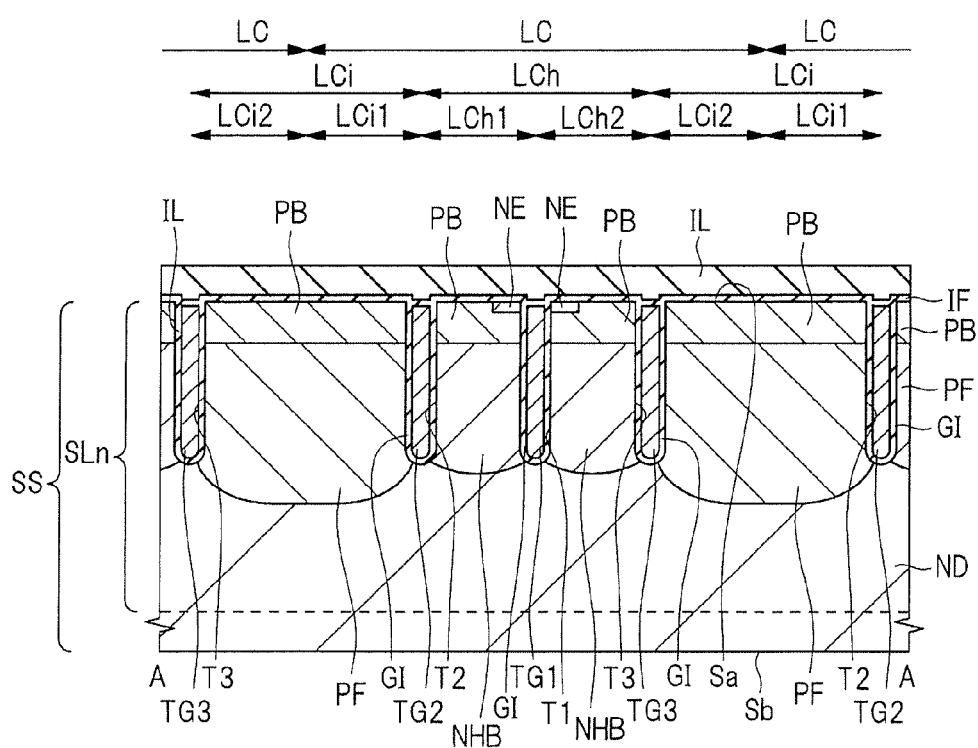
FIG. 28 is an essential-part sectional view (A-A cross section) illustrating a manufacturing step of an IGBT, following FIGS. 26 and 27.

Subsequently, the interlayer insulating film IL including, for example, a PSG (Phosphsilicate Glass) film is formed over the upper surface Sa of the semiconductor substrate SS by using, for example, a CVD process, or the like, as illustrated in FIG. 28 (A-A cross section), FIG. 29 (B-B cross section), and FIG. 30 (cross section of protective diode). The interlayer insulating film IL is formed to cover the p-type body region PB and the emitter coupling portion TGx via the insulating film IF. The thickness of the interlayer insulating film IL is, for example, approximately 0.6 μm. As the material for the interlayer insulating film IL, a BPSG (Borophosphsilicate Glass) film, an NSG (Non-doped Silicate Glass) film, an SOG (Spin-On-Glass) film, or a composite film of these films, in addition to a PSG film, can be exemplified as a preferred one.

Figure 29:
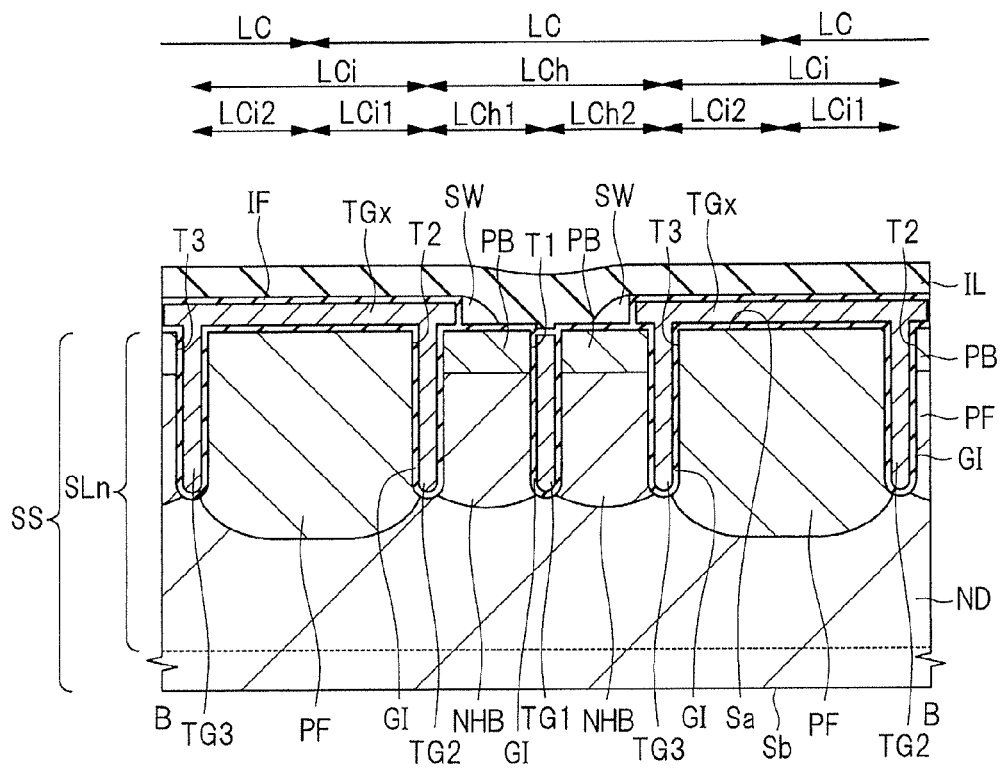
FIG. 29 is an essential-part sectional view (B-B cross section) illustrating a manufacturing step of an IGBT, following FIGS. 26 and 27.
Figure 30:
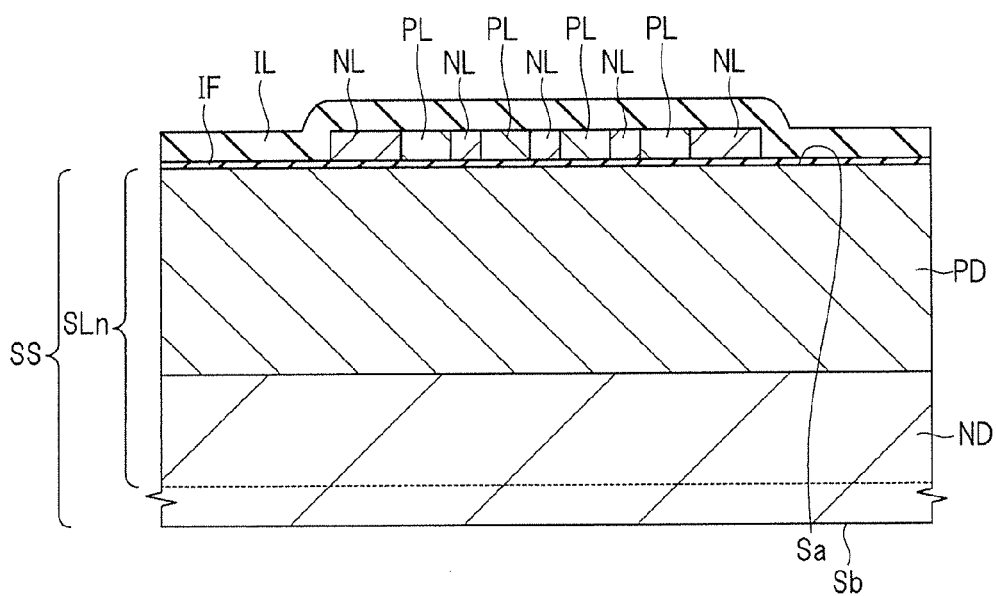
FIG. 30 is an essential-part sectional view illustrating a manufacturing step of a protective diode, following FIGS. 26 and 27.

Herein, when the interlayer insulating film IL is formed over the upper surface Sa of the semiconductor substrate SS, the surface of the interlayer insulating film IL has a gentle shape at the end of the emitter coupling portion TGx illustrated in FIG. 29 (B-B cross section). That is, the emitter coupling portion TGx, which couples together the trench T2 and the trench T3, is present below the interlayer insulating film IL in the inactive cell region LCi. Accordingly, a level difference is generated between the surface of the interlayer insulating film IL in the inactive cell region LCi and that of the interlayer insulating film IL in the hybrid cell region LCh located between the inactive cell regions LCi. However, the spacer SW is formed over the sidewall of the emitter coupling portion TGx via the insulating film IF, and hence the surface of the interlayer insulating film IL in the hybrid cell region LCh has a gentle shape, although the surface thereof is slightly lower than the surface of the interlayer insulating film IL in the inactive cell region LCi.

Figure 31:
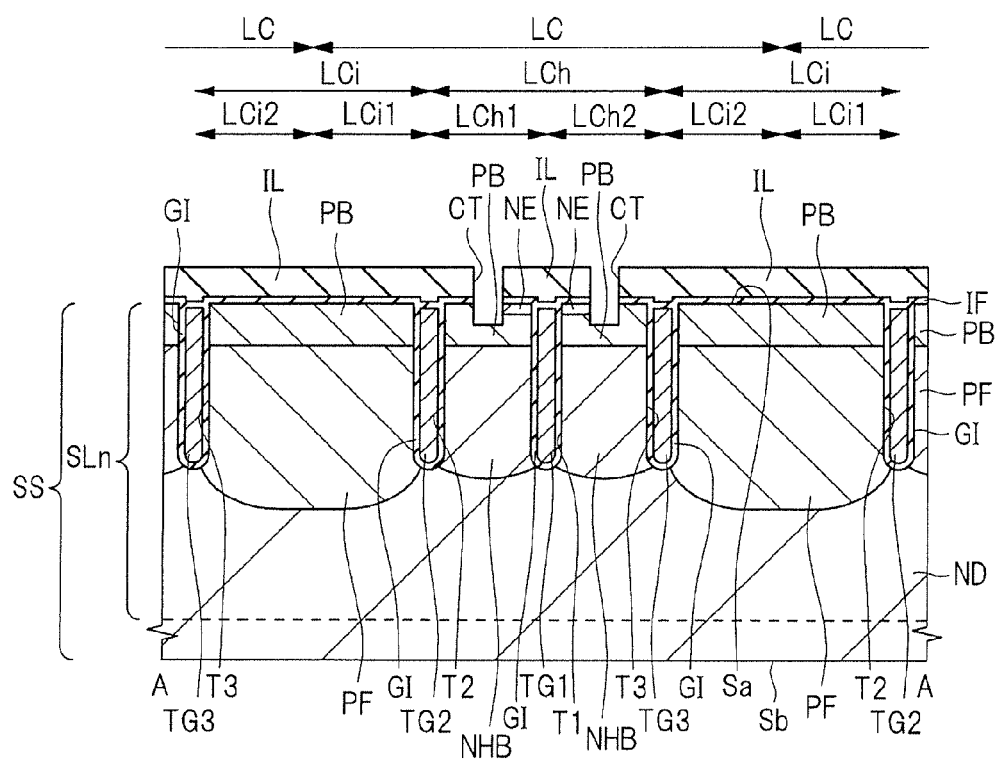
FIG. 31 is an essential-part sectional view (A-A cross section) illustrating a manufacturing step of an IGBT, following FIGS. 28 to 30.
Figure 32:
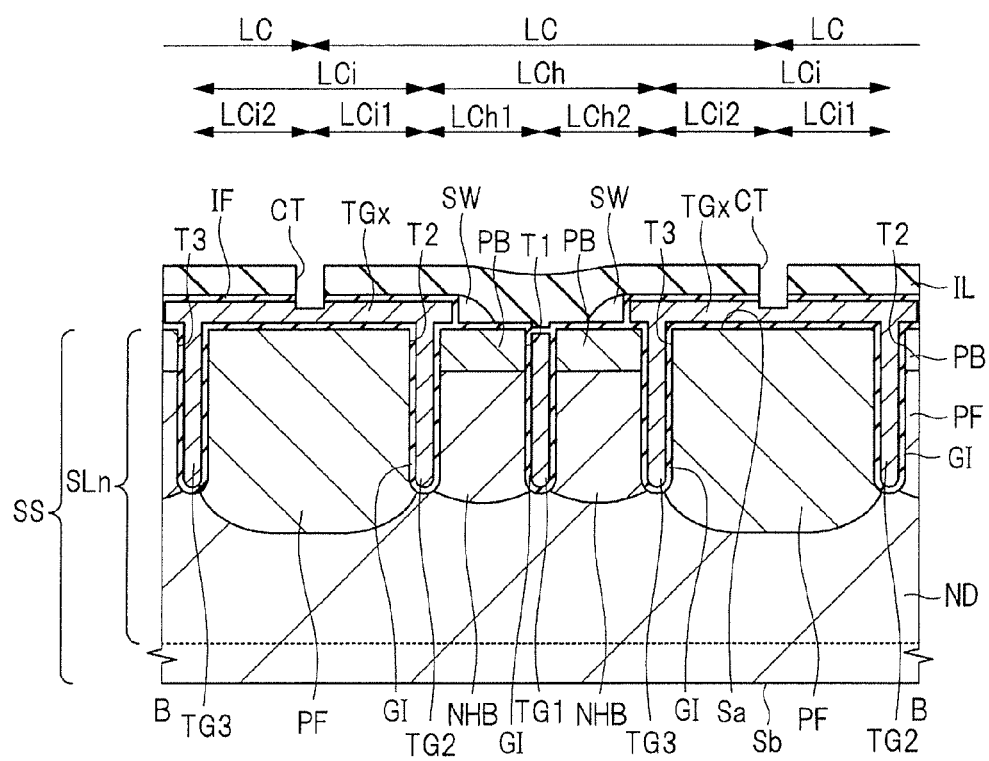
FIG. 32 is an essential-part sectional view (B-B cross section) illustrating a manufacturing step of an IGBT, following FIGS. 28 to 30.

Subsequently, a resist film for forming a contact trench (not illustrated) is formed over the interlayer insulating film IL by ordinary photolithography, as illustrated in FIG. 31 (A-A cross section) and FIG. 32 (B-B cross section). Subsequently, the contact trench CT is formed by using, for example, anisotropic dry etching, or the like. Specifically, the contact trench CT that comes in contact with the $n^+$-type emitter region NE and the contact trench CT that comes in contact with the emitter coupling portion TGx are formed. As the gas to be used for the anisotropic dry etching, for example, mixed gas including Ar gas, $CHF_3$ gas, and $CF_4$ gas, and the like, can be exemplified as preferred ones. Thereafter, the resist film for forming a contact trench that has become unnecessary is removed by ashing, or the like.

Figure 33:
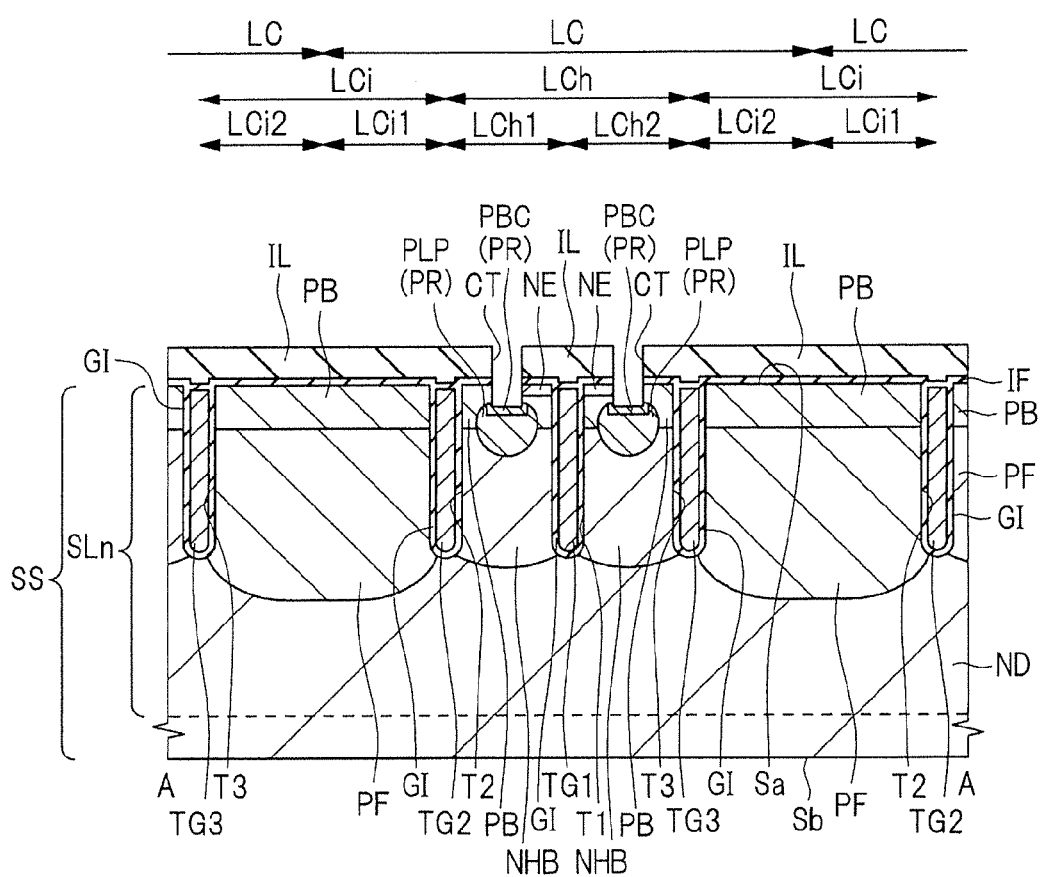
FIG. 33 is an essential-part sectional view (A-A cross section) illustrating a manufacturing step of an IGBT, following FIGS. 31 and 32.

Subsequently, the $p^+$-type body contact region PBC is formed by ion injecting p-type impurities through, for example, the contact trench CT, as illustrated in FIG. 33 (A-A cross section). As the ion injection conditions in this case, the following conditions can be exemplified as preferred ones, in which: an ionic species is, for example, boron fluoride ($BF_2$); a dose amount is approximately $5 \times 10^{15}$ cm$^{-2}$; and injection energy is approximately 80 KeV.

Similarly, the $p^+$-type latch-up prevention region PLP is formed by ion injecting p-type impurities through, for example, the contact trench CT. As the ion injection conditions in this case, the following conditions can be exemplified as preferred ones, in which: an ionic species is, for example, boron (B); a dose amount is approximately $3 \times 10^{15}$ cm$^{-2}$; and injection energy is approximately 80 KeV. The p-type impurity concentration of the $p^+$-type body contact region PBC is higher than that of the $p^+$-type latch-up prevention region PLP. The $p^+$-type semiconductor region PR is formed by the $p^+$-type body contact region PBC and the $p^+$-type latch-up prevention region PLP. The p-type impurity concentration of each of the $p^+$-type semiconductor regions PR is higher than that of the p-type body region PB.

Figure 34:
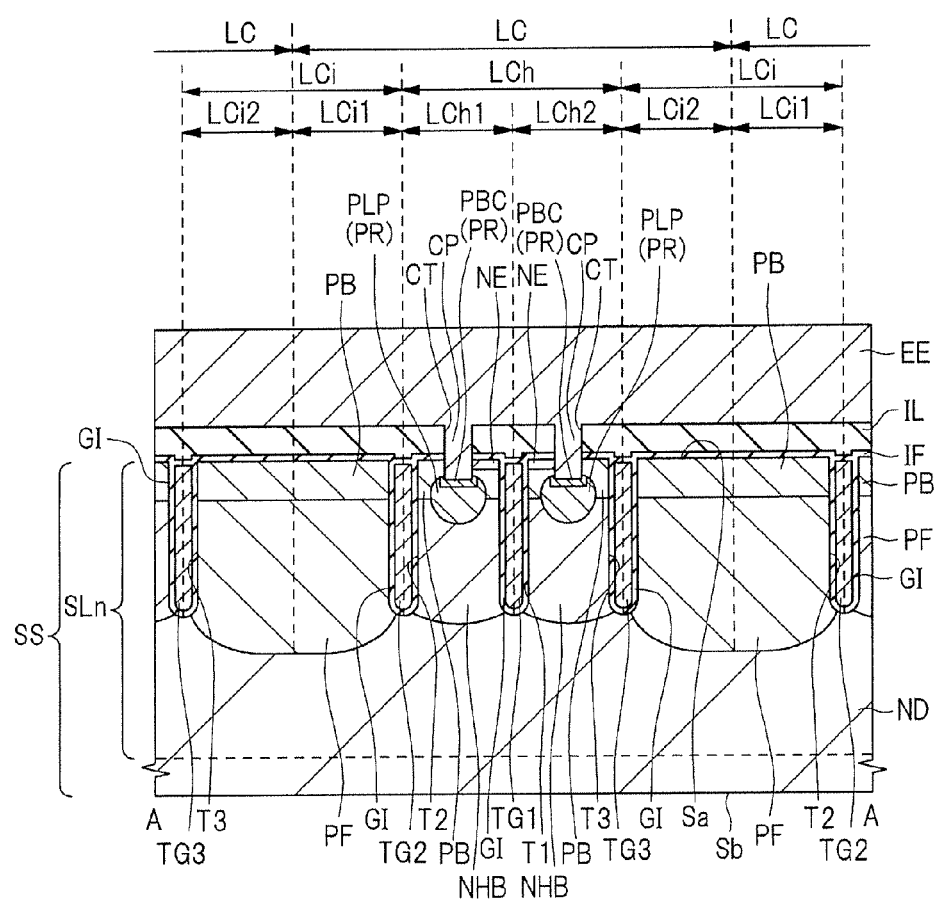
FIG. 34 is an essential-part sectional view (A-A cross section) illustrating a manufacturing step of an IGBT, following FIG. 33.
Figure 35:
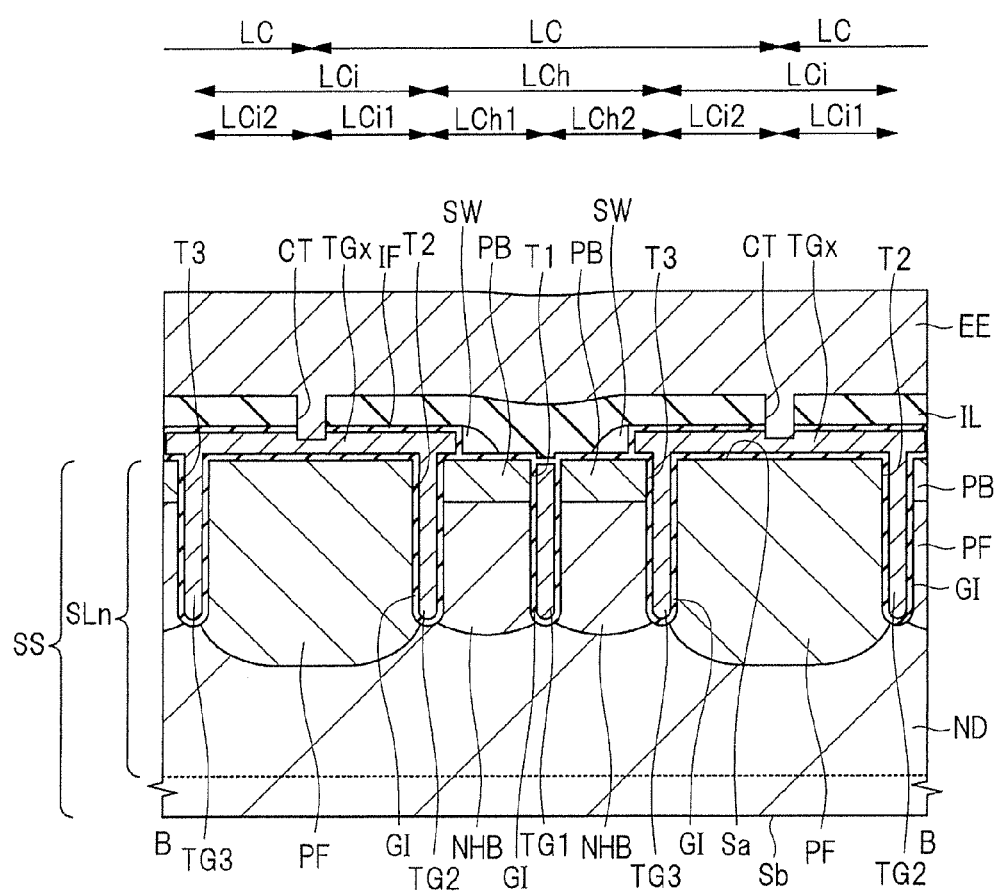
FIG. 35 is an essential-part sectional view (B-B cross section) illustrating a manufacturing step of an IGBT, following FIG. 33.

Subsequently, the emitter electrode EE is formed as illustrated in FIG. 34 (A-A cross section) and FIG. 35 (B-B cross section). For example, the following procedures are specifically executed. A TiW film is first formed, as a barrier metal film, over the upper surface Sa of the semiconductor substrate SS by using, for example, a sputtering process. The thickness of the TiW film is, for example, approximately 0.2 μm. Much of the titanium contained in the TiW film migrate to a silicon interface by the later-performed heat treatment such that silicide is formed, which contributes to an improvement in contact characteristics, but these processes are complicated, and hence they are not illustrated in the views.

Subsequently, silicide annealing is performed, for example, at approximately 600° C. for approximately 10 minutes and under a nitrogen atmosphere, and then an aluminum-based metal film (e.g., silicon is added in an amount of several percent, the balance is aluminum) is formed over the whole surface of the barrier metal film so as to fill up the contact trench CT by using, for example, a sputtering process. The thickness of the aluminum-based metal film is, for example, approximately 5 μm.

Subsequently, a resist film for forming an emitter electrode (not illustrated) is formed by ordinary photolithography. Subsequently, the emitter electrode EE including the aluminum-based metal film and the barrier metal film is patterned by using, for example, dry etching. As the gas for the dry etching, for example, $Cl_2/BCl_3$ gas, etc., can be exemplified as preferred ones. Thereafter, the resist film for forming an emitter electrode that has become unnecessary is removed by ashing, or the like.

Thereby, a plurality of the coupling electrodes CP each embedded in each of the contact trenches CT, and the emitter electrode EE formed over the interlayer insulating film IL are formed in the hybrid sub-cell region LCh1.

The emitter electrode EE is electrically coupled to the $n^+$-type emitter region NE and the $p^+$-type semiconductor regions PR, which are formed in each of the hybrid sub-cell regions LCh1 and LCh2, via the coupling electrodes CP formed in each of the hybrid sub-cell regions LCh1 and LCh2.

Alternatively, the gate electrode GE electrically coupled to the trench gate electrode TG1 (see FIG. 4) may be formed when the emitter electrode EE is formed.

Herein, each of gate wiring GL and the gate electrode GE (see FIG. 4) can be formed in the gate wiring extraction region AR2 (see FIG. 2) when the emitter electrode EE is formed, in the cell formation region AR1 (see FIG. 2).

Herein, because the surface state of the interlayer insulating film IL is reflected on that of the emitter electrode EE, the surface of the emitter electrode EE has a gentle shape and the concavities and convexities to be formed in the surface thereof are reduced.

Thus, by forming the spacer SW over the sidewall of the emitter coupling portion TGx, the level difference at the end of the emitter coupling portion TGx is reduced and the surface of the interlayer insulating film IL has a gentle shape, and hence stress is dispersed, not concentrated in an acute angle portion of the emitter coupling portion TGx when an emitter wire is coupled to the emitter electrode EE (emitter pad EP), and hence occurrence of a crack can be suppressed. Further, the concavities and convexities to be formed in the surface of the emitter electrode EE can be reduced by reflecting the surface state of the interlayer insulating film IL having a gentle shape, and hence the adhesiveness between the emitter electrode EE (emitter pad EP) and the emitter wire can be improved. Thereby, the yield and reliability of a semiconductor device can be improved.

Figure 36:
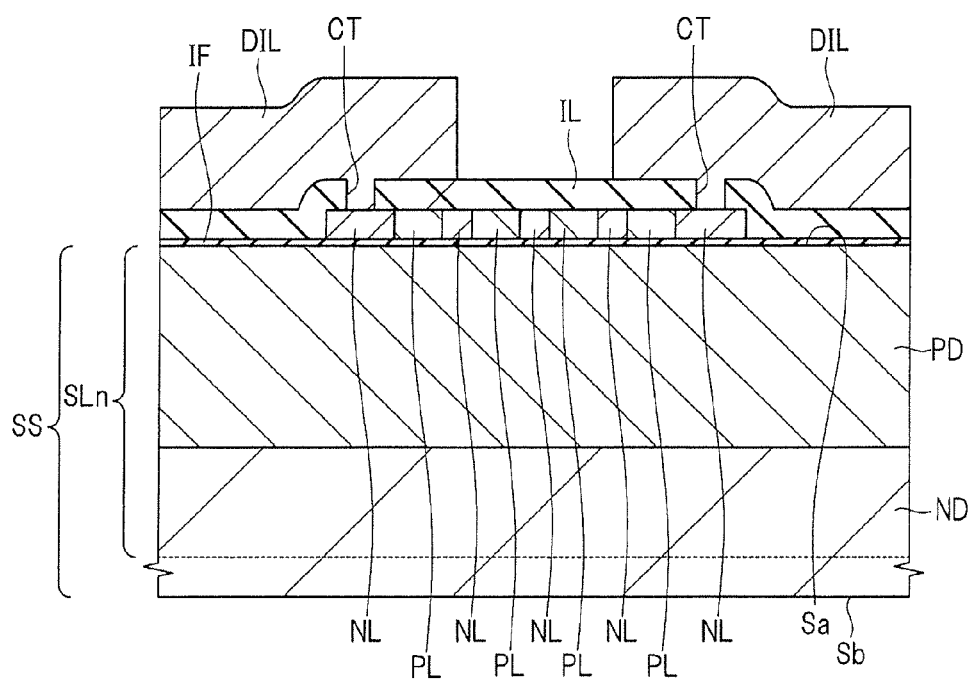
FIG. 36 is an essential-part sectional view illustrating a manufacturing step of a protective diode, following FIG. 33.

Furthermore, when the emitter electrode EE is formed, diode wiring DIL, which is to be electrically coupled to the $n^+$-type layer NL at on one end of the protective diode, may be formed via the contact trench CT opened at the interlayer insulating film IL over $n^+$-type layer NL at the one end of the protective diode, as illustrated in FIG. 36 (cross section of protective diode). Similarly, when the emitter electrode EE is formed, diode wiring DIL, which is to be electrically coupled to the $n^+$-type layer NL at the other end of the protective diode, may be formed via the contact trench CT opened at the interlayer insulating film IL over the $n^+$-type layer NL at the other end of the protective diode. Although not illustrated, the p-type layer PD is electrically coupled to the emitter electrode EE.

Figure 37:
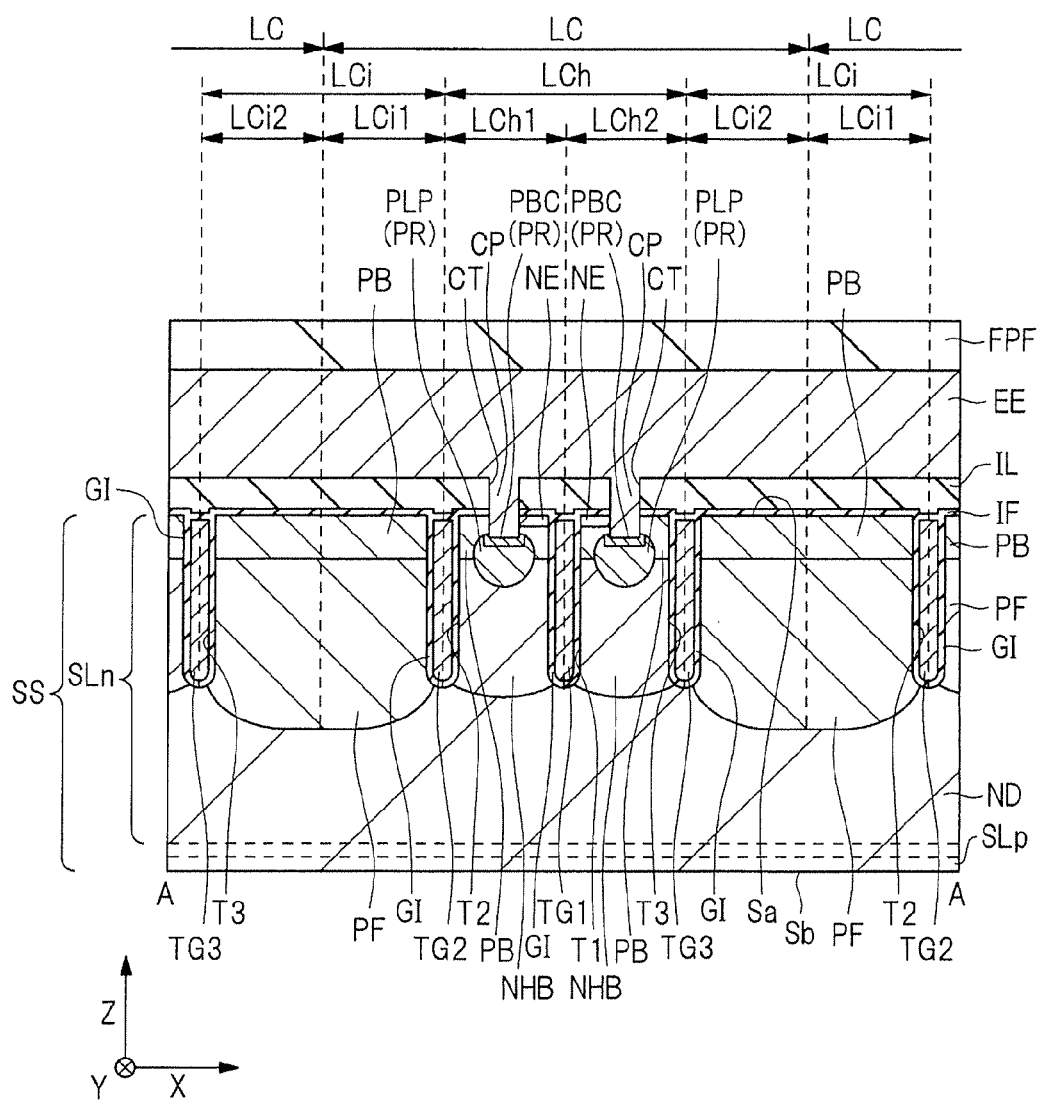
FIG. 37 is an essential-part sectional view (A-A cross section) illustrating a manufacturing step of an IGBT, following FIGS. 34 to 36.
Figure 38:
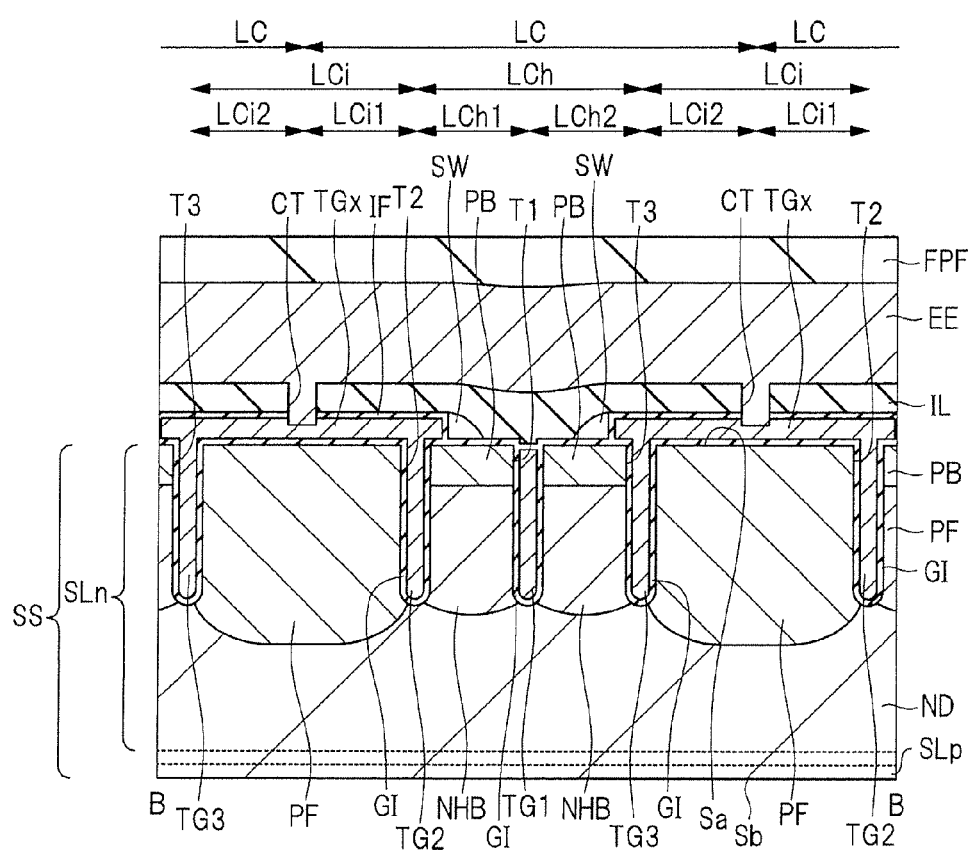
FIG. 38 is an essential-part sectional view (B-B cross section) illustrating a manufacturing step of an IGBT, following FIGS. 34 to 36.

Subsequently, an insulating film (passivation film) FPF, including an organic film, or the like, that contains, for example, polyimide as a main component, is formed over the emitter electrode EE, as illustrated in FIG. 37 (A-A cross section) and FIG. 38 (B-B cross section). The thickness of the insulating film FPF is, for example, approximately 2.5 μm.

Subsequently, a resist film for forming an opening (not illustrated) is formed by ordinary photolithography.

Subsequently, an opening OP1 (see FIG. 4), which penetrates the insulating film FPF to reach the emitter electrode EE, is formed by patterning the insulating film FPF with the use, for example, of dry etching, whereby the emitter pad EP (see FIG. 4), including a portion of the emitter electrode EE exposed at the opening OP1, is formed. Thereafter, the resist film for forming an opening that has become unnecessary is removed by ashing, or the like.

In the cell formation region AR1 (see FIG. 4), when the insulating film FPF is formed over the emitter electrode EE, the insulating film FPF is formed over the gate electrode GE (see FIG. 4) in the gate wiring extraction region AR2 (see FIG. 4). Also, in the cell formation region AR1 (see FIG. 4), when the opening OP1 is formed, an opening OP2 (see FIG. 4), which penetrates the insulating film FPF to reach the gate electrode GE, is formed in the gate wiring extraction region AR2 (see FIG. 4), whereby the gate pad GP, including a portion of the gate electrode GE exposed at the opening OP2, is formed.

Subsequently, the semiconductor substrate SS having a thickness, for example, of approximately 800 μm is thinned, for example, to approximately 30 μm to 200 μm, if necessary, by performing back grinding processing on the lower surface Sb thereof. For example, when a withstand voltage of approximately 600 V is used, the final thickness becomes approximately 70 μm. Thereby, the semiconductor layer SLp is formed in a portion of the thinned semiconductor substrate SS, the portion being located on the side of the lower surface Sb with respect to the semiconductor layer SL. If necessary, chemical etching, etc., are also performed to remove a damage from the lower surface Sb.

Of the thinned semiconductor substrate SS, a semiconductor layer where the $p^+$-type collector region CL (see FIG. 1) is formed, the semiconductor layer being located on the side of the lower surface Sb with respect to a semiconductor layer where an n-type field stop region Ns (see FIG. 1) is formed, is indicated by the semiconductor layer SLp.

Subsequently, the n-type field stop region Ns is formed in the lower surface Sb of the semiconductor substrate SS by introducing n-type impurities with the use, for example, of ion injection, as illustrated in FIG. 1. As the ion injection conditions in this case, the following conditions can be exemplified as preferred ones, in which: an ionic species is, for example, phosphorus (P); a dose amount is approximately $7 \times 10^{12}$ cm$^{-2}$; and injection energy is approximately 350 KeV. Thereafter, laser annealing, etc., are performed on the lower surface Sb of the semiconductor substrate SS in order to activate the impurities, if necessary.

Subsequently, the $p^+$-type collector region CL is formed in the lower surface Sb of the semiconductor substrate SS by introducing p-type impurities with the use, for example, of ion injection. As the ion injection conditions in this case, the following conditions can be exemplified as preferred ones, in which: anionic species is, for example, boron (B); a dose amount is approximately $1 \times 10^{13}$ cm$^{-2}$; and injection energy is approximately 40 KeV. Thereafter, laser annealing, etc., are performed on the lower surface Sb of the semiconductor substrate SS in order to activate the impurities, if necessary.

That is, in the step of forming the p+-type collector region CL, the p-type semiconductor layer SLp is formed in a portion of the semiconductor substrate SS, the portion being located on the side of the lower surface Sb with respect to the semiconductor layer SLn, and the p+-type collector region CL is formed by the p-type semiconductor layer SLp.

Subsequently, the collector electrode CE, which is electrically coupled to the semiconductor layer SLp, i.e., to the p+-type collector region CL, is formed in the lower surface Sb of the semiconductor substrate SS by using, for example, a sputtering process. Thereafter, a semiconductor device according to the present embodiment is completed by dividing into the chip region of the semiconductor substrate SS with the use of dicing, or the like, and then by sealing it in a package, if necessary.

(Variation)

Figure 39:
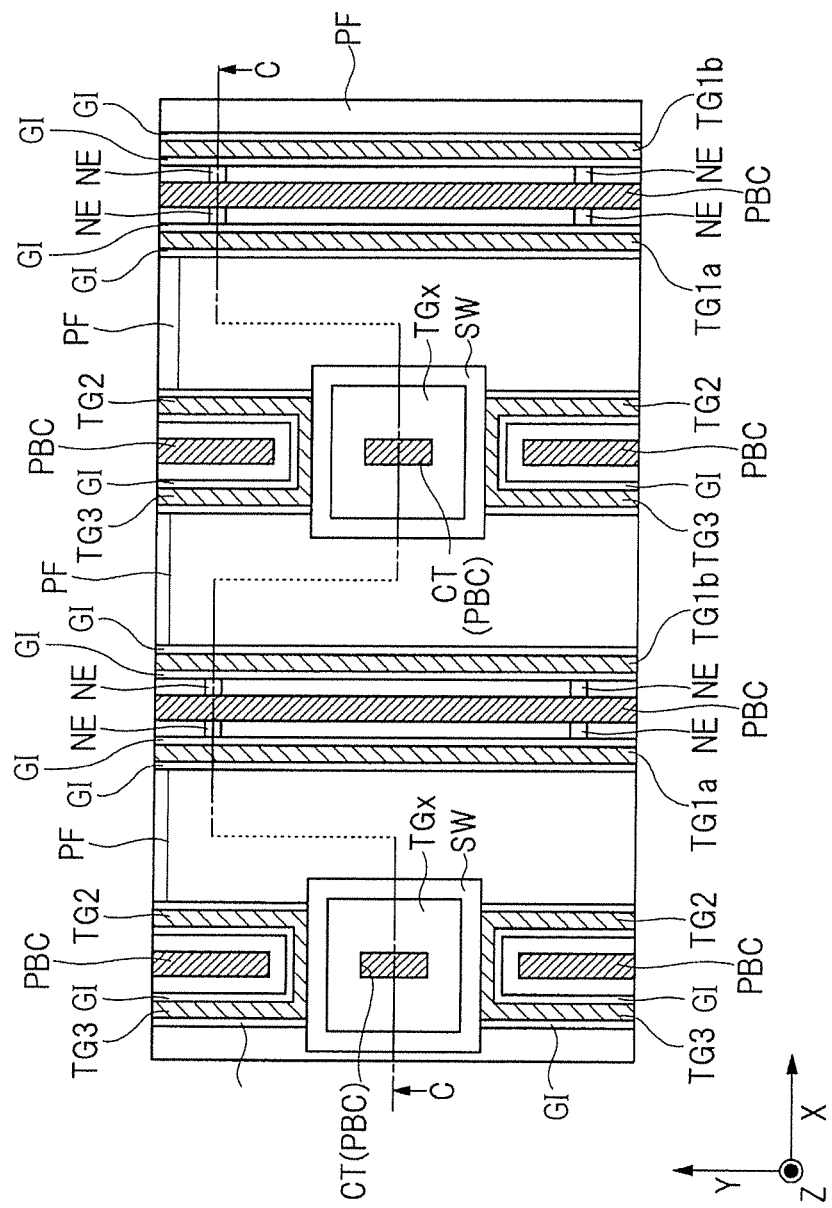
FIG. 39 is a plan view illustrating a configuration of a semiconductor device according to a variation of an embodiment.
Figure 40:
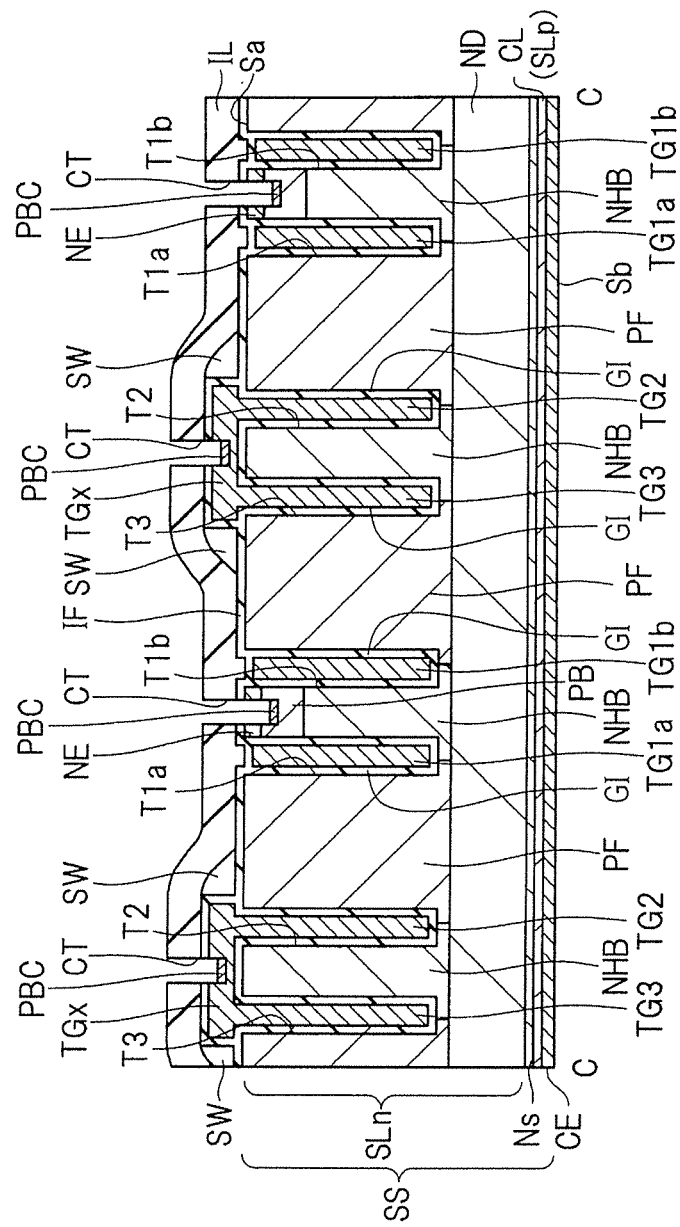
FIG. 40 is a sectional view illustrating a configuration of a semiconductor device according to a variation of an embodiment.

A semiconductor device according to a variation of the present embodiment will be described with reference to FIGS. 39 and 40. FIG. 39 is a plan view illustrating a configuration of a semiconductor device according to a variation of the embodiment. FIG. 40 is a sectional view illustrating a configuration of a semiconductor device according to the embodiment, and corresponds, for example, to the C-C cross section in FIG. 39.

A semiconductor device according to the aforementioned embodiment is an EGE-type trench gate IGBT, in which, among the three trench gate electrodes TG1, TG2, and TG3 that are arrayed to be spaced apart from each other, the trench gate electrode TG1 arranged in the center is electrically coupled to the gate electrode GE, and each of the two trench gate electrodes TG2 and TG3 arranged at both the sides thereof is electrically coupled to the emitter electrode EE (see FIG. 2).

On the other hand, the semiconductor device according to the variation is a so-called "alternate array system" IE-type trench gate IGBT (see Patent Document 1). Of four trench gate electrodes arrayed to be spaced apart from each other, each of two trench gate electrodes (TG1a, TG1b) arranged in the center is electrically coupled to a gate electrode, and each of two trench gate electrodes (TG2, TG3) arranged at both the ends is electrically coupled to an emitter electrode, and hence the IE-type trench gate IGBT may also be referred to as a GGEE type (gate-gate-emitter-emitter type).

That is, the four trench gate electrodes TG1a, TG1b, TG2, and TG3 are arrayed to be spaced apart from each other, in which the two trench gate electrodes TG1a and TG1b, each of which is electrically coupled to the gate electrode GE, and the two trench gate electrodes TG2 and TG3, each of which is electrically coupled to the emitter electrode EE, are alternately arranged, as illustrated in FIG. 39. Additionally, the p-type body region PB is formed in the semiconductor substrate SS between the two trench gate electrodes TG1a and TG1b, and the N+-type emitter region NE is provided on the side of the upper surface Sa of the semiconductor substrate SS. The contact trench CT that reaches the p-type body region PB is provided between the two trench gate electrodes TG1a and TG1b, and the P+-type body contact region PBC is provided in the lower end portion of the contact trench CT, and the N-type hole barrier region NHB is provided below the P+-type body contact region PBC.

Also, in the semiconductor device according to the variation, the trench gate electrodes TG2 and TG3 are electrically coupled together by the emitter coupling portion TGx extending in the X direction, as illustrated in FIG. 40. The emitter coupling portion TGx is formed integrally with the trench gate electrodes TG2 and TG3, and is electrically coupled to the emitter electrode EE via the contact trench CT formed in the interlayer insulating film IL. With such an structure, the reliability of the electrical coupling between each of the trench gate electrodes TG2 and TG3 and the emitter electrode EE can be improved without depending on a microfabrication process whose cost is unnecessarily high.

The spacer SW is formed over the sidewall of the emitter coupling portion TGx via the insulating film IF. Accordingly, by forming the spacer SW over the sidewall of the emitter coupling portion TGx, stress is dispersed, not concentrated in an acute angle portion of the emitter coupling portion TGx when an emitter wire is coupled to the emitter electrode EE (emitter pad EP), and hence occurrence of a crack can be suppressed, similarly to a semiconductor device according to the aforementioned embodiment. Further, by forming the spacer SW, the concavities and convexities to be formed in the surface of the emitter electrode EE (emitter pad EP) can be reduced, whereby the adhesiveness between the emitter electrode EE and the emitter wire can be improved. Thereby, the yield and reliability of a semiconductor device can be improved.

The invention made by the present inventors has been specifically described above based on preferred embodiments, but the invention should not be limited to the preferred embodiments, and it is needless to say that various modifications may be made to the invention within a range not departing from the gist of the invention.

What is claimed is:

1. A semiconductor device comprising:
   a semiconductor substrate having a first main surface and a second main surface opposite to the first main surface;
   a first semiconductor region of a first conductivity type provided on the side of the second main surface of the semiconductor substrate;
   a second semiconductor region of a second conductivity type different from the first conductivity type, which is provided on the side of the first main surface of the semiconductor substrate so as to come in contact with the first semiconductor region;
   a first trench that penetrates the second semiconductor region to reach the first semiconductor region;
   a second trench that penetrates the second semiconductor region to reach the first semiconductor region and is provided to be spaced apart from the first trench;
   a third semiconductor region of the first conductivity type that is provided in the second semiconductor region so as to come in contact with a first side surface of the first trench;
   a first trench gate electrode provided inside the first trench via a first insulating film;
   a second trench gate electrode provided inside the second trench via a second insulating film;
   a coupling portion that is provided over the first main surface via a third insulating film and is formed integrally with the second trench gate electrode;
   a spacer provided over a side surface of the coupling portion;
   a fourth insulating film provided over the first main surface so as to cover a top surface of the coupling portion and the spacer;
   a first opening that penetrates the fourth insulating film to come in contact with the third semiconductor region;
   a second opening that penetrates the fourth insulating film to come in contact with the coupling portion;

a first electrode that is electrically coupled to the third semiconductor region via the first opening and is electrically coupled to the coupling portion via the second opening, and a fifth insulating film provided over the first electrode and having a third opening.

2. The semiconductor device according to claim 1, wherein the spacer is arranged in the third opening.

3. The semiconductor device according to claim 2, wherein the first electrode has a portion in the third opening which a wire couples to.

4. The semiconductor device according to claim 1, wherein the coupling portion is formed over the second trench, and is not formed over the first trench.

5. The semiconductor device according to claim 1, wherein a thickness of the coupling portion is 0.5 μm to 1.5 μm.

6. The semiconductor device according to claim 1, wherein the spacer includes polycrystalline silicon.

7. The semiconductor device according to claim 1, further comprising:

a second electrode that is provided above the first main surface so as to be electrically coupled to the first trench gate electrode, wherein the fifth insulating film provided over the second electrode and having a fourth opening exposing a part of the second electrode.

* * * * *